US006856586B2

(12) United States Patent
Usui et al.

(10) Patent No.: US 6,856,586 B2
(45) Date of Patent: Feb. 15, 2005

(54) RECORDING CLOCK GENERATING DEVICE AND METHOD THEREOF

(75) Inventors: Makoto Usui, Osaka (JP); Hironori Deguchi, Kadoma (JP); Takahiro Ochi, Kyoto (JP); Yasuhiro Ueki, Sagamihara (JP); Mitsuhiko Ohta, Yokohama (JP); Yutaka Osada, Fujisawa (JP)

(73) Assignees: Matsushita Electric Industrial Co., Ltd., Osaka (JP); Victor Company of Japan Limited, Kanagawa (JP)

( * ) Notice: Subject to any disclaimer, the term of this patent is extended or adjusted under 35 U.S.C. 154(b) by 423 days.

(21) Appl. No.: 09/983,977

(22) Filed: Oct. 26, 2001

(65) Prior Publication Data

US 2002/0110059 A1 Aug. 15, 2002

(30) Foreign Application Priority Data

Oct. 27, 2000 (JP) .......................................  2000-328769

(51) Int. Cl.[7] ............................................ G11B 7/0045
(52) U.S. Cl. .................................. 369/47.28; 369/53.34
(58) Field of Search ............................. 369/47.28, 47.3, 369/47.31, 53.34

(56) References Cited

U.S. PATENT DOCUMENTS

| | | | | | |
|---|---|---|---|---|---|
| 4,872,155 | A | * | 10/1989 | Yokogawa et al. ...... | 369/47.28 |
| 5,703,851 | A | * | 12/1997 | Ando ...................... | 369/47.28 |
| 6,081,490 | A | * | 6/2000 | Kuroda et al. ........... | 369/47.28 |
| 6,363,042 | B1 | * | 3/2002 | Sakashita ................. | 369/47.28 |
| 6,487,149 | B1 | * | 11/2002 | Yokoi et al. ............. | 369/47.25 |
| 6,700,847 | B2 | * | 3/2004 | Osada ..................... | 369/53.34 |

FOREIGN PATENT DOCUMENTS

| | | |
|---|---|---|
| EP | 0 930 617 | 7/1999 |
| JP | 10-293926 | 11/1998 |
| JP | 11-203785 | 7/1999 |

\* cited by examiner

*Primary Examiner*—Hoa T. Nguyen
*Assistant Examiner*—Peter Vincent Agustin
(74) *Attorney, Agent, or Firm*—Wenderoth, Lind & Ponack, L.L.P.

(57) ABSTRACT

Crosstalk between tracks, land prepit leakage, and effects of recording power modulation can cause the wobble signal period to change irregularly, thereby producing jitter in the recording clock which is derived by frequency multiplying the wobble signal. This problem is resolved by a recording clock generating circuit having an arrangement to average the wobble signal period, a timer for generating a rectangular wave with substantially the same period as the average period, and a frequency multiplying PLL for multiplying the timer output. The period averaging arrangement in particular determines the approximate average period at every wobble period and reflects the phase difference between the wobble signal and the timer in the timer setting so as to improve recording clock stability.

2 Claims, 15 Drawing Sheets

RECORDING CLOCK GENERATING DEVICE AND METHOD THEREOF

BACKGROUND OF THE INVENTION

1. Field of the Invention

The present invention relates to a device for generating a recording clock for recording to an optical disk, typically DVD-R or DVD-RW media, having wobbled recording grooves, and a method thereof.

2. Description of the Related Art

A typical method for generating the recording clock for recording to an optical disk having wobbled recording grooves such as those that are printed to DVD-R media is known, for example, from Japanese Patent Laid-Open Publication (kokai) H10-293926. The wobble signal is a continuous signal with a frequency component that is synchronized to disk rotation. The cited method uses this characteristic to generate a recording clock signal that is precisely synchronized to disk rotation by generating a clock signal phase that is synchronized to the continuous signal with a frequency multiplied PLL. The wobble signal is produced by detecting reflection from the groove by using a detector which is segmented in the tracking direction, passing the difference of the signals from the detector segments (a push-pull signal) through a bandpass filter, and digitizing the output of the bandpass filter.

As the recording density of newer optical disk media has increased, the track pitch has decreased to the point where crosstalk between adjacent groove tracks cannot be ignored. This is particularly a problem with DVD-R media, which is written with a CLV format, because if the wobble phase shifts in each rotation of the disk, the wobble phase will not match from track to track. Even more specifically, the wobble signal will be modulated by crosstalk between the tracks. Conventional optical discs of this type also have a prepit signal consisting of prepits that are formed at a specific interval to the lands (and therefore are called land prepits). The phase of this land prepit signal that is detected from the optical disk can therefore be compared with the phase of the wobble signal so as to output a phase difference signal, which is then used to correct the phase of the recording clock signal. In other words, variation in the time base of the clock signal based on a wobble signal containing track crosstalk that cannot be ignored is corrected by using a land prepit signal that is not affected by crosstalk so as to generate a recording clock signal that is synchronized with high precision to disk rotation.

Phase correction on DVD-R media is known to require a correction of ±30 degrees for a 360° wobble period. The recording clock for DVD-R media is obtained by multiplying the wobble signal by 186. It is therefore necessary to correct the phase of 186×(30/360)=16 clock periods in order to correct the phase of the recording clock. Because a stable phase correction for more than one recording clock period is difficult, a practical design such as the one disclosed in Kokai H10-293926 uses two phase-locked loops That is, the cited design uses a first PLL to output at the period of a relatively low frequency wobble signal, then shifts the phase of the first PLL output, and uses a second PLL to frequency multiply the shifted first PLL output so as to generate the recording clock.

A further problem is that if the wobble period fluctuates in an area where there are no land prepits, recording clock jitter increases. A method has also been proposed for resolving this problem by changing the response characteristic of the second PLL in the areas where there are and there are not land prepits so that the PLL response characteristic is lowered where there are no land prepits and recording clock jitter is thus improved.

Problems relating to generating the recording clock for an optical disk having a wobbled recording groove are described below.

First, as noted above, recording density has increased to the point where crosstalk between adjacent groove tracks cannot be ignored. With 4.7 GB DVD-R media, for example, the track pitch is 0.74 $\mu$m and the wobble period is 24.7 $\mu$m. The track pitch is thus smaller than that of first generation 3.9 GB DVD-R media, and the wobble signal phase varies periodically at the relatively slow frequency of about 5.3 revolutions. Phase correcting the recording clock generating PLL using the land prepit signal provides a certain improvement in recording clock jitter resulting from crosstalk, but the only method that has been proposed to address jitter in areas where there are no land prepits is to lower the PLL response. A method for handling land prepits detection errors has not been disclosed.

Furthermore, a practical phase shift circuit according to the prior art requires two PLL circuits, a PLL set to the wobble frequency of 140 kHz, and a 26 MHz frequency multiplying PLL for generating the recording clock. The problem with this configuration is the circuit scale increases. More particularly, digital chip processes are increasingly directed to smaller device dimensions with an emphasis on high speed, highly integrated circuit designs. The problem with a 140 kHz wobble frequency PLL is that the low frequency makes integration into modern digital chips difficult. If many analog PLL components such as charge pumps and VFO devices are built in to a digital chip, chip size increases, high precision noise management is required to assure the desired PLL jitter performance, and chip design is thus made more difficult. A further problem is the basic incompatibility between the analog phase shift circuit and a digital chip design. The analog phase shift circuit is usually used to shift the output phase of a 140 kHz wobble frequency PLL.

Second, while the wobble signal is generated by digitizing the push-pull signal output from the bandpass filter, the land prepit signal is also superimposed on the push-pull signal. The land prepit signal is not completely removed by the bandpass filter. More specifically, the wobble signal edge shifts when a land prepit is near the slice level for digitizing the wobble, and the wobble signal period is therefore not correct.

Third, the sensing level of the photodetector in the write head varies greatly according to laser power modulation for recording marks and spaces when recording to a disk. With DVD-R media, for example, laser modulation switches between 11 mW at a recording mark and 0.7 mW at a space, and there is therefore over a 10× variation in photodetector output between the marks and spaces. The wobble signal is extracted by obtaining a push-pull signal from the photodetector output and passing the result through a bandpass filter, and the effects of variations in recording power are therefore largely removed. However, some effect of power modulation remains in the push-pull signal and power modulation near the slice level for digitizing the wobble shifts the wobble signal edge so that the wobble signal period is not correct.

Fourth, the amplitude and DC level of the light that is sensed by the photodetector vary greatly during recording because the laser power changes from the read power level to the record power level. With DVD-R media, the read power level is typically 0.7 mW and the average record power level for marks and spaces during recording is approximately 7 mW or about ten times the read power level. If this difference is passed straight through the bandpass filter and digitized, the amplifier will be saturated during recording and the signal will be buried in noise during reproduction. An automatic gain control (AGC) circuit is therefore normally inserted to the RF amplifier so as to absorb this fluctuation, and feedback control is used to keep the signal amplitude constant before being digitized. However, correct digitizing cannot be expected during the transient states immediately after the start and end of recording, the wobble signal period will vary greatly, and wobble signal detection will be difficult for a time.

Fifth, while crosstalk effects are reduced by phase compensation based on the land prepits, the recording clock fluctuates when the land prepits are incorrectly detected or not detected. Yet further, land prepit detection also has a high frequency jitter component as a result of the recording power fluctuation discussed in the third problem above.

Finally, no specific solution for the second to fifth problems described above is known from the prior art.

SUMMARY OF THE INVENTION

A first aspect of the present invention provides a recording clock generating device for recording data to an optical disk having a recording groove that is wobbled at a specific frequency in the radial direction, and prepits that are formed at a unit interval including a specific number of wobble periods. The recording clock generating device of the first aspect includes: a wobble signal detector which detects recording groove wobble and outputs a wobble signal; a prepit detector which detects prepits; a period averaging arrangement which obtains an average period for periods of the wobble signal; a timer for generating a rectangular wave with a period which is substantially equal to the average period that is obtained by the period averaging arrangement; and a frequency multiplying PLL for multiplying timer output and generating a recording clock. The period averaging arrangement calculates an average of wobble signal periods in a period averaging interval, where the period averaging interval contains one or a plurality of unit intervals.

The period averaging interval is selected so that the prepits are uniformly distributed, thereby reducing the effects of the prepits on wobble period fluctuation. Using an average of the periods reduces the effects of wobble edge shift due to recording power variation. An accurate recording clock can therefore be generated.

A second aspect of the present invention provides a recording clock generating device for recording data to an optical disk having a recording groove that is wobbled at a specific frequency in the radial direction, and prepits that are formed at a unit interval including a specific number of wobble periods. The recording clock generating device of the second aspect includes: a wobble signal detector which detects recording groove wobble and outputs a wobble signal; a prepit detector which detects prepits; a period averaging arrangement which obtains an average period for periods of the wobble signal; a timer for generating a rectangular wave with a period which is substantially equal to the average period that is obtained by the period averaging arrangement; and a frequency multiplying PLL for multiplying timer output and generating a recording clock. The period averaging arrangement calculates the average period in an interval having no prepits on the inside circumference side or the outside circumference side of the recording groove.

The period averaging interval is selected so that there are no prepits, thereby eliminating the effects of the prepits on wobble period fluctuation. Using an average of the periods reduces the effects of wobble edge shift due to recording power variation. An accurate recording clock can therefore be generated.

A third aspect of the present invention provides a recording clock generating device for recording data to an optical disk having a recording groove that is wobbled at a specific frequency in the radial direction, and prepits that are formed at a unit interval including a specific number of wobble periods. The recording clock generating device of the third aspect includes: a wobble signal detector which detects recording groove wobble and outputs a wobble signal; a prepit detector which detects prepits; a period averaging arrangement which obtains an average period for periods of the wobble signal; a timer for generating a rectangular wave with a period which is substantially equal to the average period that is obtained by the period averaging arrangement; and a frequency multiplying PLL for multiplying timer output and generating a recording clock. The period averaging arrangement has a set which measures a total time of N (where N is a specific integer) wobble signal periods and holding the time as a cumulative period V, and a set which measures a next wobble period X, subtracting $(1/N)$ of the cumulative period V from the cumulative period V, adding X to the resultant difference, and using the resultant sum as a new total time for N periods.

Recording clock response to wobble period variation, discontinuity in the timer period where the averaging intervals meet, and recording clock jitter is improved by updating the average period every wobble period.

A fourth aspect of the present invention provides a recording clock generating device for recording data to an optical disk having a recording groove that is wobbled at a specific frequency in the radial direction, and prepits that are formed at a unit interval including a specific number of wobble periods. The recording clock generating device of the fourth aspect includes: a wobble signal detector which detects recording groove wobble and outputs a wobble signal; a prepit detector which detects prepits; a period averaging arrangement which obtains an average period for periods of the wobble signal; a timer for generating a rectangular wave with a period which is substantially equal to the average period that is obtained by the period averaging arrangement; a frequency multiplying PLL for multiplying timer output and generating a recording clock; and a phase difference measuring set which measures a phase difference Z between the wobble signal and the rectangular wave. The period averaging arrangement has a set which measures a total time of N (where N is a specific integer) wobble signal periods and holds the time as a cumulative period V, and a set which measures a next wobble period X, subtracting $(1/N)$ of the cumulative period V from the cumulative period V, adding X to the resultant difference, correcting the phase difference Z, and using the resultant sum as a new total time for N periods.

By updating the average period every wobble period, controlling the timer period so that the phase difference between the wobble signal and rectangular output wave from the timer is reduced, recording clock response to wobble period variation, discontinuity in the timer period where the averaging intervals meet, and a shift in the phase of the rectangular timer output wave to the phase of the wobble signal due to accumulation of error in conjunction with the period averaging process can be prevented.

Further preferably, the recording clock generating device also has: a recording start detector which detects a specific time from the start of recording; a recording end detector which detects a specific time from the end of recording; a drop detector which detects if a wobble signal is dropped; and a first timer controller for holding the timer output period if the specific time from the start of recording, the specific time from the end of recording, or wobble signal drop is detected.

In this case, it is also possible to eliminate the effects of a dropped wobble signal causing an abnormal average for the wobble signal period, and disruption of the wobble period until the automatic gain control of the RF amplifier responds immediately after the start and the end of recording.

Yet further preferably, the recording clock generating device also has a second timer controller for limiting a change in the timer output period to a specific amount or less if a difference between the average period that is calculated by the period averaging arrangement and the period of the rectangular wave of the timer output is the specific amount or greater.

In this case, it is also possible to suppress a sudden change in timer output and improve recording clock stability even if the wobble period is greatly disrupted for some unexpected reason. The wobble signal period cannot normally vary greater than the disk eccentricity or the maximum acceleration of the disk motor. Suppressing variations in the period exceeding this level is therefore also effective against external disturbances and noise.

Yet further preferably, the recording clock generating device also has a timer count storage arrangement which stores the timer count each time a prepit signal is detected, and a low-pass filter for removing high frequency components in the timer count storage arrangement output. The frequency multiplying PLL operates so as to correct the phase of the recording clock according to low-pass filter output.

In this case, it is also possible to detect the phase difference between the recording clock and prepits at the clock, and by inserting a low-pass filter, shifting of the PLL phase due to prepit detection errors can be prevented. A single PLL can also be effectively used for recording clock phase correction.

Other objects and attainments together with a fuller understanding of the present invention will become apparent and appreciated by referring to the following description and claims when taken in conjunction with the accompanying drawings.

DETAILED DESCRIPTION OF THE INVENTION

Figure 2:
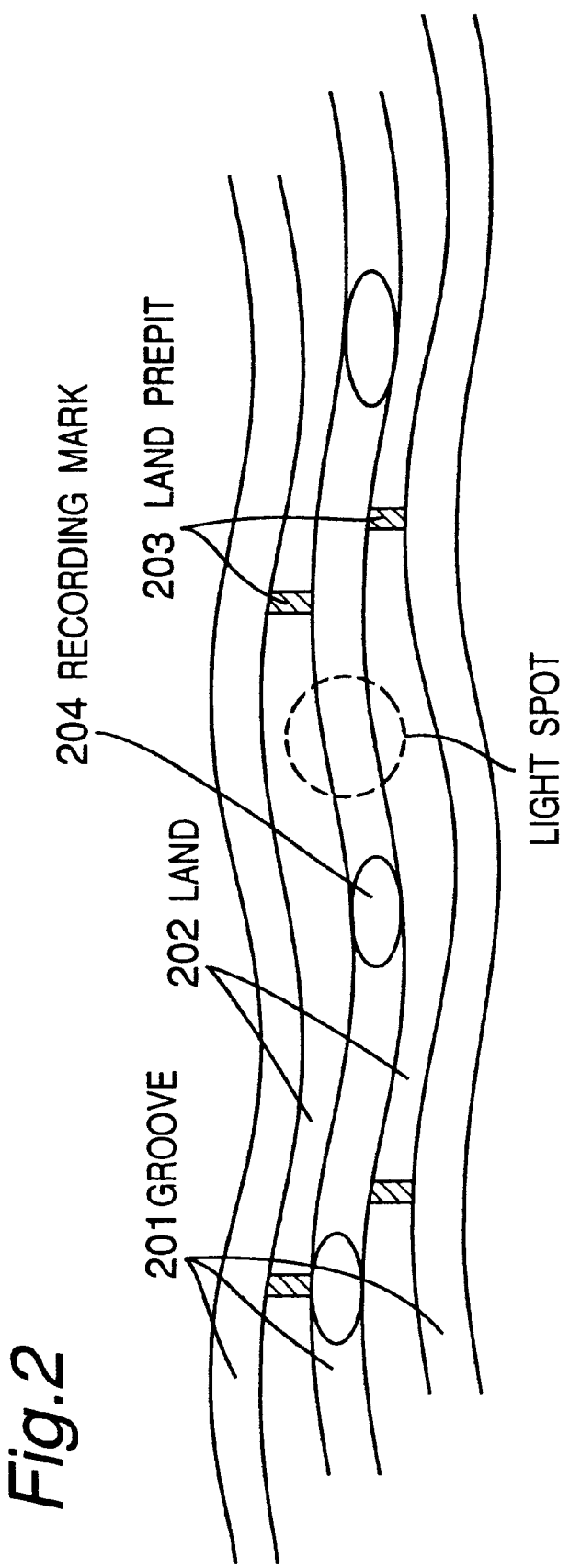
FIG. 2 shows the disk grooves.

The preferred embodiments of the present invention are described below with reference to the accompanying figures.
First Embodiment The typical groove configuration of a disk as conceived by the present invention is shown in FIG. 2. Shown in FIG. 2 are a groove 201, land 202, a land prepit 203 that is formed on a land, and a recording mark 204 that is recorded to a groove. The undulations in the recording grooves are called "wobble" and are used to detect the linear velocity of the disk. The land prepits are used to generate the recording clock and for CLV control. In DVD-R and DVD-RW discs, the wobble period is 186 times the recording clock frequency. The land prepits 203 are encoded with address information and are used for detecting a precise location on the disk.

Figure 3:
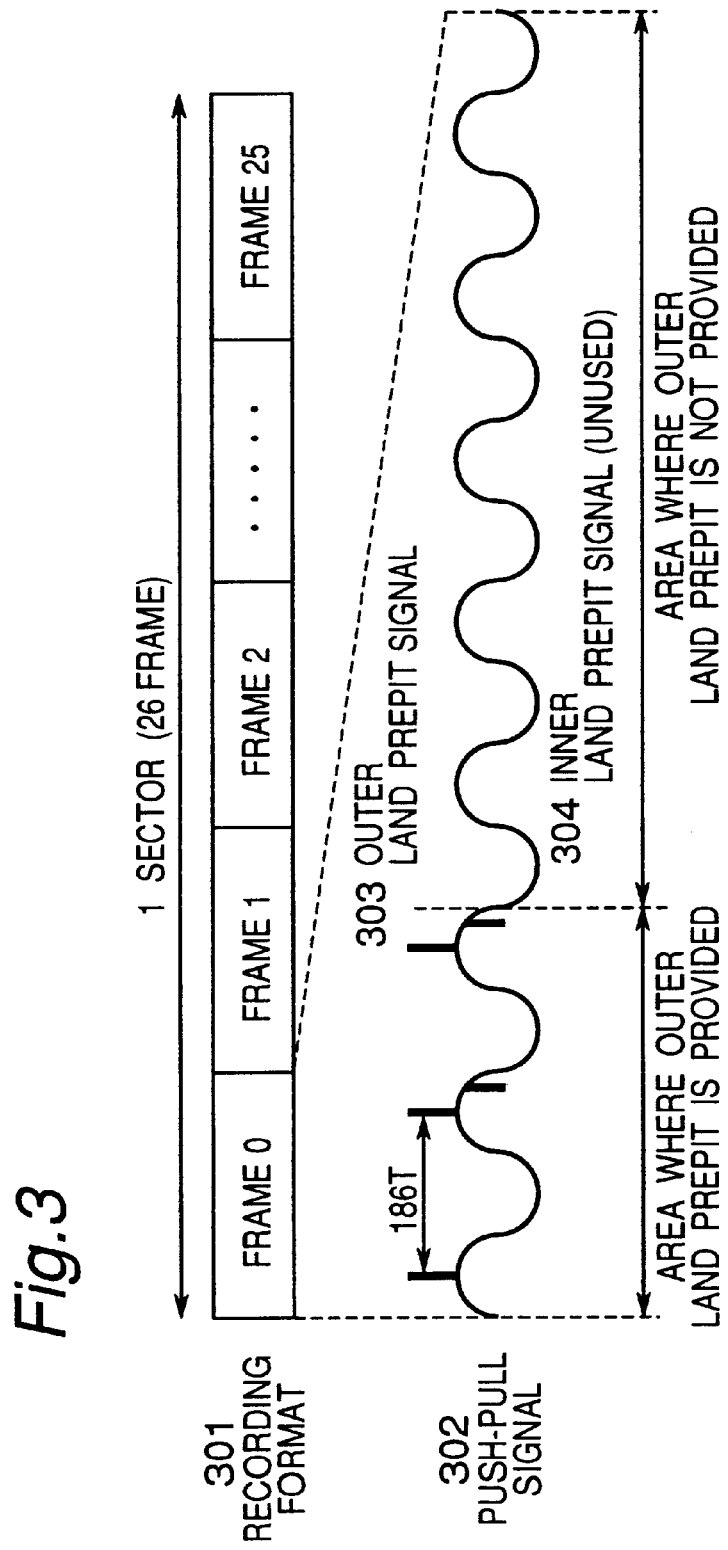
FIG. 3 shows the disk recording format.

The recording format of the disk is shown in FIG. 3. As shown in FIG. 3, the recording format 301 has 26 frames per sector; one frame has a length of eight wobble periods. A photodetector which is divided into plural photodetection segments in a line that is substantially parallel to the tracking direction detects light that is reflected from the groove, and the difference between the signals from these photodetection segments is determined so as to obtain the push-pull signal 302. The wobble signal is derived by passing this push-pull signal 302 through a bandpass filter which passes only the wobble frequency and then digitizing the bandpass filter output. The land prepit signal appears above and below the push-pull signal 302. The outer land prepit signal 303 on the outside circumference side of the disk appears above the push-pull signal, and the inner land prepit signal 304 on the inside circumference side of the disk appears below the push-pull signal, for example, but the actual arrangement depends on the polarity of the difference.

During actual decoding of the address information, only outer the land prepit signal on the outside circumference side of the disk is sliced and extracted, and the inner land prepit signal on the inside circumference side of the disk is ignored. In even frames, the land prepit signal is usually located in the first three periods of the eight wobble signal periods, as shown in FIG. 3. In odd frames, the land prepits on the inside circumference side and the land prepits on the outside circumference side overlap and produce interference. This is described in further detail below.

As shown in FIG. 3, the land prepits are in principle formed at the first three periods (period 1, period 2, period 3) of the wobble signal in each even frame of a sector. That is, the land prepits are formed every unit interval containing a specific number of wobble periods. In the example shown in FIG. 3, this unit interval is equivalent to two frames. A 3-bit (bit 2, bit 1, bit 0) land prepit signal is formed based on whether or not a land prepit is present. In frame 0 of each sector, the land prepit signal is 111, thus indicating the first frame in the sector. The land prepit signal that is formed by the first three wobble signal periods in even frames other than the first frame 0, that is, frames 2, 4, 6, and so forth, is either 101 or 100, where a land prepit signal of 101 indicates a data value of 1 and a land prepit signal of 100 indicates a value of 0. This data can be combined to express address information or other data. The even frames can thus be used for synchronization and addressing.

The land prepits on the outside and inside circumference sides are generally offset and are not in line in the radial direction, but the outside and inside land prepits may be arranged in line every certain period. Where the land prepits are in line can also be calculated. This is because the wobble phase shifts each disk revolution in a CLV format disk. If the land prepits on the outside and inside are aligned in the radial direction, the push-pull signal that is obtained by these land prepits will be counterbalanced, and no land prepit signal will be detected. As a result, the location of the land prepits is exceptionally changed from an even number frame to a next odd number frame. In other words, if the land prepit on frame 0 aligns in the radial direction with a land prepit on a frame in a neighboring track, frame 1 will be used for forming land prepit signal (110) indicating the leading position of the odd number frames for synchronization. If the land prepit on frame 2 aligns in the radial direction with a land prepit on a frame in a neighboring track, frame 3 will be used for forming land prepit signal (101) or (100) indicating data "1" or "0". The same can be said to the other even number frames 4, 6, 8 and so on.

The decoding of the land prepits is shown in Table 1.

TABLE 1

| bit 2 | bit 1 | bit 0 | meaning |
|---|---|---|---|
| 1 | 1 | 1 | even frame sync |
| 1 | 1 | 0 | odd frame sync |
| 1 | 0 | 1 | data = 1 |
| 1 | 0 | 0 | data = 0 |

If a land prepit is detected only in the first and last of the three periods, the signal is decoded according to line 3 (101) in Table 1. A specific address on the disk can be identified by decoding the land prepits for 16 sectors.

Furthermore, as previously described above, wave distortion resulting from crosstalk between adjacent tracks is contained in the push-pull signal, and land prepits at the inside circumference side are offset from land prepits at the outside circumference side by 0.74×3.14≈2.3 µm per disk revolution.

Figure 4:
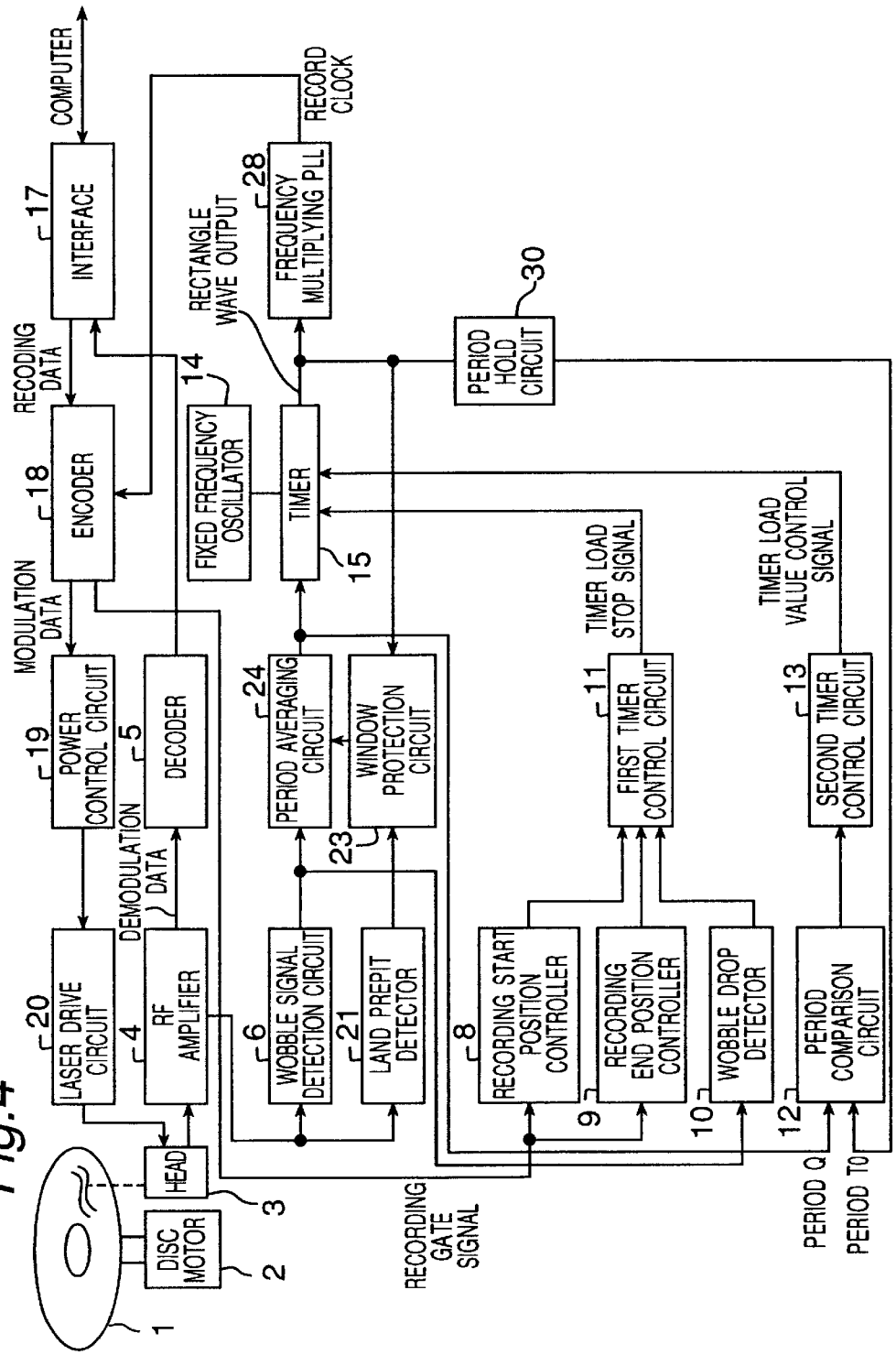
FIG. 4 is a block diagram of a first embodiment of the present invention.

A block diagram of the present invention is shown in FIG. 4. Referring to FIG. 4, an optical head 3 has a two-part photodetector for detecting light that is reflected from the optical disk 1 which is driven by a disk motor 2 and converting the detected light to an electrical signal. The RF amplifier 4 adds the outputs from the two photodetector parts and passes the total RF signal to decoder 5, and outputs the push-pull signal, that is, the difference of the two outputs, to the wobble signal detection circuit 6 and the land prepit detector 21.

Focus tracking control is also needed to control the disk drive, but technology for this is known from the literature and is not fundamentally related to the present invention, and is therefore not shown in FIG. 4.

The decoder 5 demodulates the data. The wobble signal detection circuit 6 extracts the wobble signal from the push-pull signal. The period averaging circuit 24 obtains the average of the wobble periods. The recording start position controller 8 detects a specific period from the start of recording based on a recording gate signal that is output from the encoder 18. The recording gate signal indicates the time that the data is modulated by the encoder 18 and laser power is modulated for recording. The recording end position controller 9 detects a specific period from when recording ends based on the recording gate signal. The wobble drop detector 10 detects when the wobble signal is dropped. The first timer control circuit 11 suppresses loading the average period to the timer 115 and holds the output period from the timer 15.

The period hold circuit 30 holds the average period that is passed to the timer 15 every 16 wobble periods. The period comparison circuit 12 compares the average period Q which is detected by the period averaging circuit 7 and the period T0 of the previous rectangular wave that is output from the timer 15 so as to determine if the difference therebetween exceeds a particular threshold value. If the period difference that is detected by the period comparison circuit 12 is greater than or equal to the threshold value, the second timer control circuit 13 applies a specific limit to the average period that is applied to the timer 15. This is described in further detail below.

The fixed frequency oscillator 14 generates a clock for operating the timer 15. The oscillation frequency of this fixed frequency oscillator 14 must be set to a frequency sufficiently higher than the wobble signal frequency.

The average period Q which is detected by the period averaging circuit 24 is applied to the timer 15, which generates a rectangular wave with a period that is substantially equal to this average period Q. The frequency multiplying PLL 28 generates a recording clock at a frequency which is 186 times the frequency of the rectangular wave that is output by the timer 15. Data is sent to and received from a computer through the interface 17. The encoder 18 modulates the recording data passed from the interface 17 at the timing of the recording clock that is output from the frequency multiplying PLL 28, and passes the modulated recording data to the power control circuit 19. The encoder 18 also outputs a recording gate signal corresponding to the data modulation period to the recording start position controller 8 and the recording end position controller 9. The power control circuit 19 controls laser power. The laser drive circuit 20 then emits a laser beam at the recording power level.

The land prepit detector 21 detects the land prepits described above. The window protection circuit 23 generates a window in which the land prepit signal is expected to appear, and prevents land prepit detection errors by passing only those land prepits that pass through this generated window.

The operation of this first embodiment of the invention will now be described. The period averaging circuit 24 obtains the average period within a specific time for the wobble signal that is passed from the wobble signal detection circuit 6. This average period can be obtained, for example, by counting a time of 16 wobble signal periods, that is, a period averaging interval, and the counted time from the beginning to the end of this 16 wobble signal periods is divided by 16. A time period which is counted from a start to the end of a predetermined number of (for example 16) wobble signal periods is referred to as a unit interval, and a period containing one or a plurality of unit intervals is referred to as a period averaging interval. The prepits are formed in any one of the unit intervals. The land prepits that are detected by the land prepit detector 21 are passed through the window protection circuit 23 and input to the period averaging circuit 24, and are used to determine the starting point for this period averaging interval. The detailed operation of the period averaging circuit 24 is described further with reference to FIG. 5 and FIG. 6.

The resulting average period is, in principle, passed as the timer value to the timer 15. The operating clock of the timer 15 is a fixed frequency, and by operating the fixed frequency oscillator 14 at a frequency which is sufficiently higher than this average period, a stable square wave with a period that is substantially equal to the average period can be generated. The frequency multiplying PLL 28 frequency multiplies the timer output so as to generate the recording clock.

It should be noted that until the automatic gain control of the RF amplifier 4 responds immediately after the start of recording, that is, immediately after the laser shifts from the read power to the record power level, and immediately after recording ends, that is, the laser shifts from the recording power to the read power level, the push-pull signal can fluctuate greatly, wobble signal detection may temporarily not be possible, and the wobble signal period may fluctuate. In this case, operation of the first timer control circuit 11 suppresses loading a new average period to the timer 15 and causes the period of the rectangular wave which is output from the timer 15 to be held if the recording start position controller 8 output signal indicating a specific time from the start of recording, the recording end position controller 9 output signal indicating a specific time from the end of recording, or the wobble drop detector 10 output signal indicating that the wobble signal was dropped, is detected. This improves stability when the recording clock is in a transient state. The AGC response time of a typical optical disk drive is approximately 200 μsec, and holding the recording clock period for this amount of time creates no practical problem.

Wobble drop detection is also effective when the wobble signal period is disrupted due to the presence of scratches or foreign matter on the disk surface. Wobble drop is detected when the wobble period is significantly longer than the standard wobble period, or when the photodetector sum signal is less than or equal to a specific threshold value due to the presence of dust or scratches on the disk surface.

The period comparison circuit 12 compares the average period Q which is calculated by the period averaging circuit 24 and the timer output period T0 that is held by the period hold circuit 30. When the period difference which is detected by the period comparison circuit 12 exceeds this threshold value, the second timer control circuit 13 functions so as to limit the variation in the updated period that is applied by the RF amplifier 4 to the decoder 5 to a specific amount or less. The period comparison circuit 12 is described in further detail with reference to FIG. 7 and FIG. 8.

The encoder 18 modulates the data that is sent from the interface 17 according to the timing of the recording clock that is output from the frequency multiplying PLL 28. The modulated data is then passed through the power control circuit 19 and the laser drive circuit 20 so as to drive the laser in the head 3. The encoder 18 outputs a recording gate signal according to the data modulation interval to the recording start position controller 8 and the recording end position controller 9.

Figure 5:
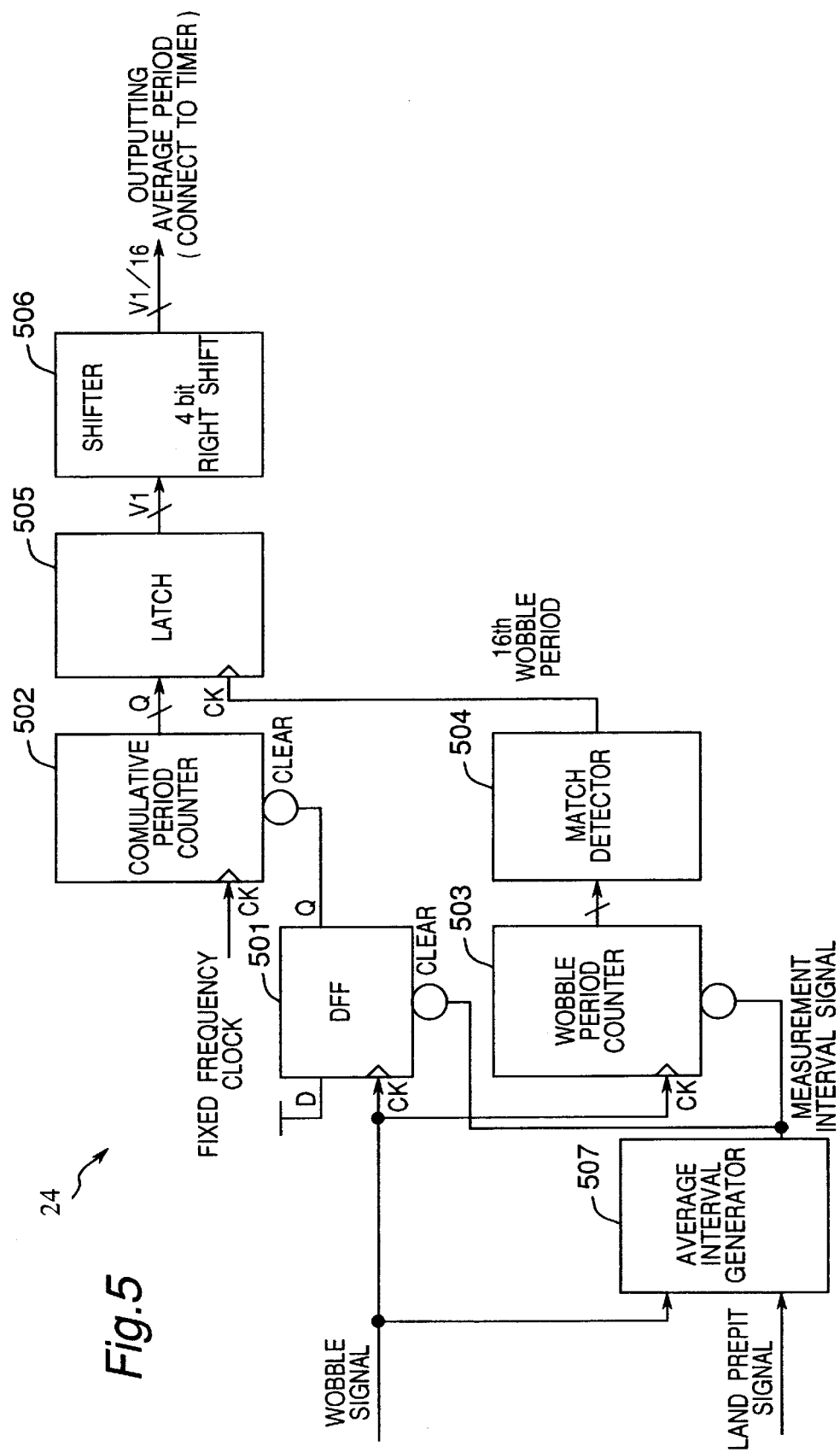
FIG. 5 is a block diagram of a period averaging circuit in a first embodiment of the invention.
Figure 6:
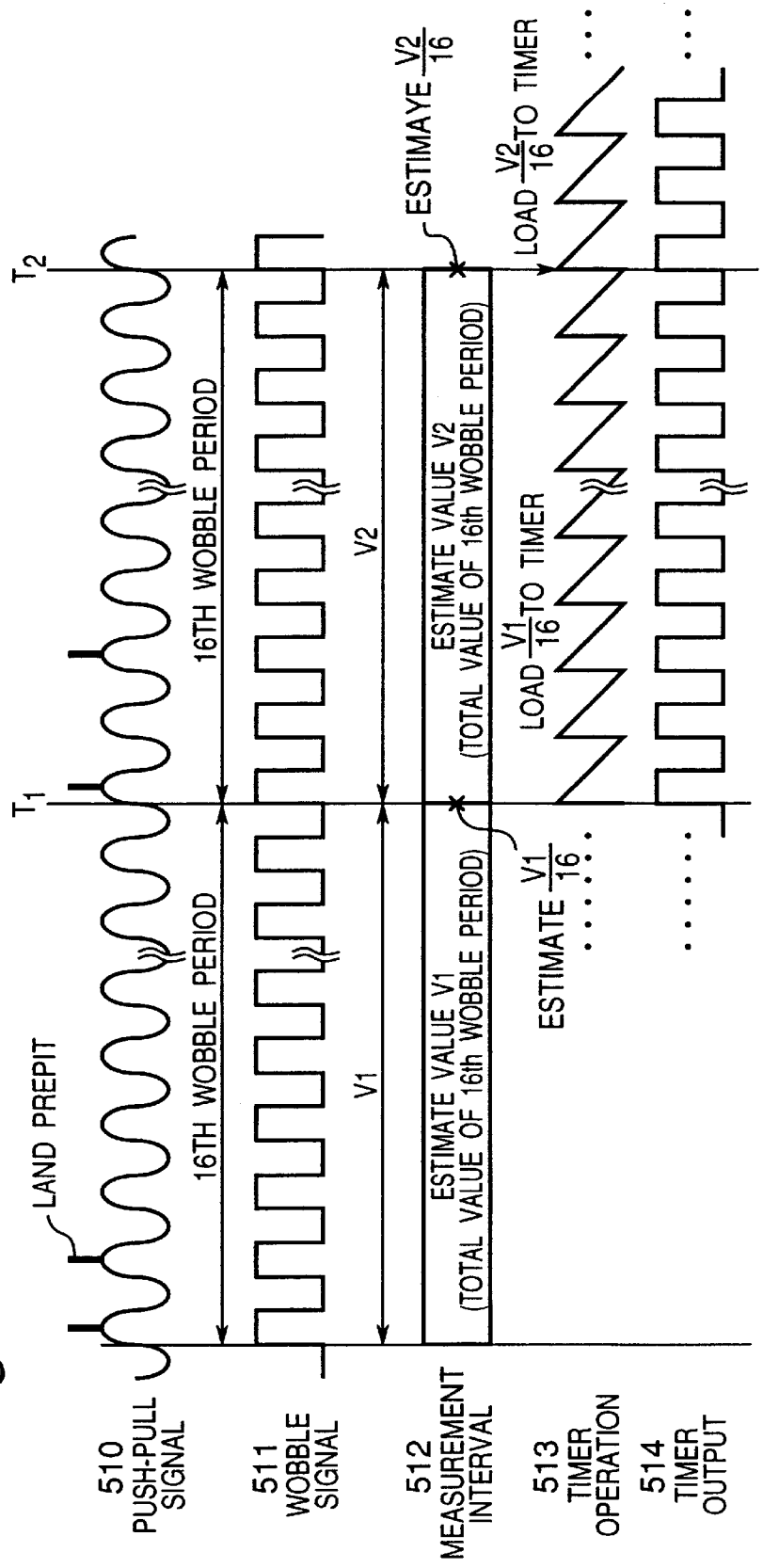
FIG. 6 describes the operation of the period averaging circuit in the first embodiment of the invention.

The operation of the period averaging circuit 24 will now be described in detail. FIG. 5 is a block diagram of the period averaging circuit 24, and FIG. 6 illustrates the operation of the period averaging circuit 24. The example described below obtains the average of 16 wobble signal periods. Referring to FIG. 5, the total time of the wobble period is measured by the D flip-flop 501 and the cumulative period counter 502. The wobble period counter 503 counts the periods in the wobble signal. The match detector 504 detects whether 16 wobble periods have been input. The latch 505 holds the time measurement, and the shifter 506 divides the output of the latch 505. The average interval generator 507 generates an average interval from a land prepit position.

Shown in FIG. 6 are a push-pull signal 510, a wobble signal 511, a measurement interval 512, a timer operation 513 simulating the timer count, and the rectangular wave output 514 from the timer.

The average interval generator 507 shown in FIG. 5 outputs a signal indicating a two frame measurement interval, that is, a unit interval, corresponding to the measurement interval 512 shown in FIG. 6 based on the land prepit timing, and the measurement interval signal at the rising edge of the wobble signal, that is, slightly before the leading edge of the two frames. The measurement interval signal should include the trailing edge of the 16th wobble signal, that is the measurement interval signal is to include the leading edge of the next two frames, and is not to include the edge of the frame just before. This can be done easily by monitoring the wobble signal periods being counted. The measurement starting time of the interval is the time when the wobble signal is input to the D flip-flop 501. The measurement interval signal output by the average interval generator 507 and the wobble signal are connected to the D flip-flop 501. The D flip-flop 501 is used to start the cumulative period counter 502 precisely at the rising edge of the wobble signal.

When the measurement interval signal is output from the average interval generator 507, the rising edge of the wobble signal is input, the D flip-flop 501 is set, clearing the cumulative period counter 502 is cancelled, and time measurement based on the fixed frequency clock starts. The wobble period counter 503 counts the periods of the input wobble signal. The match detector 504 outputs the clock when the 16th wobble period is detected, and if the count of the cumulative period counter 502 is V1 at this time, for example, V1 is copied to latch 505. The latched value is thus a value that is measured at the resolution of the fixed frequency. The latch output is divided by 16 as a result of being shifted 4 bits to the right by the shifter 506, thereby obtaining V1/16 or the average of 16 periods. The configuration of a circuit for measuring the average wobble signal period has been described in simple terms above. Modifying the cumulative period counter 502 so as to continuously measure the average of successive 16 period intervals will also be simple for one skilled in the art, and further description thereof is thus omitted below.

The measurement interval of the average interval generator 507 is further described with reference to FIG. 6. The measurement interval for obtaining the average period of the wobble signal starts from the rising edge of one wobble period having a land prepit as shown in the measurement interval 512 and measures the time of 16 periods. As described with reference to FIG. 3 and Table 1, the land prepits appear at a regular period every two frames. The measurement interval generating circuit can therefore check the pattern of the land prepits so as to estimate the measurement interval. The circuit can be variously configured to predict where the first pulse (111 or 110) in the land prepits shown in Table 1 will appear, and output the measurement interval signal for the 16 periods from the beginning of the wobble signal period including that point. The average length of one wobble period, that is, the average of the wobble signal periods, can then be obtained by dividing the total time which is required to measure those 16 periods by 16. This same time measurement is thereafter repeated for every 16 wobble periods, the result is divided by 16, and the quotient is applied to the timer 15 as the average period. After the average period is loaded, the timer 15 continues oscillating at the same frequency as shown in the timer operation 513 (refer to FIG. 6) until the next average period is loaded. While the average period measurement interval has been described to be 16 periods because the land prepits appear every two frames (which is equivalent to 16 periods), it will also be obvious that the average period could be obtained for every 64 wobble periods.

In the example shown in FIG. 6, the effects of wobble wave distortion from the land prepits can be substantially evenly dispersed in each period averaging interval by using the first land prepit position as the starting point for the period measuring interval and by using an integer multiple of the interval at which the land prepits appear as the width of the averaging interval.

The operation at time T1 in FIG. 6 will now be described. V1/16 is calculated at time T1, and the result of V1/16 is loaded to the timer 15 and to the period hold circuit 30. After time T1, the timer 115 outputs a pulse as the timer output at each loaded period (V1/16). After time T1, the period averaging circuit 24 starts counting period V2 of the next 16 wobble periods.

Figure 9:
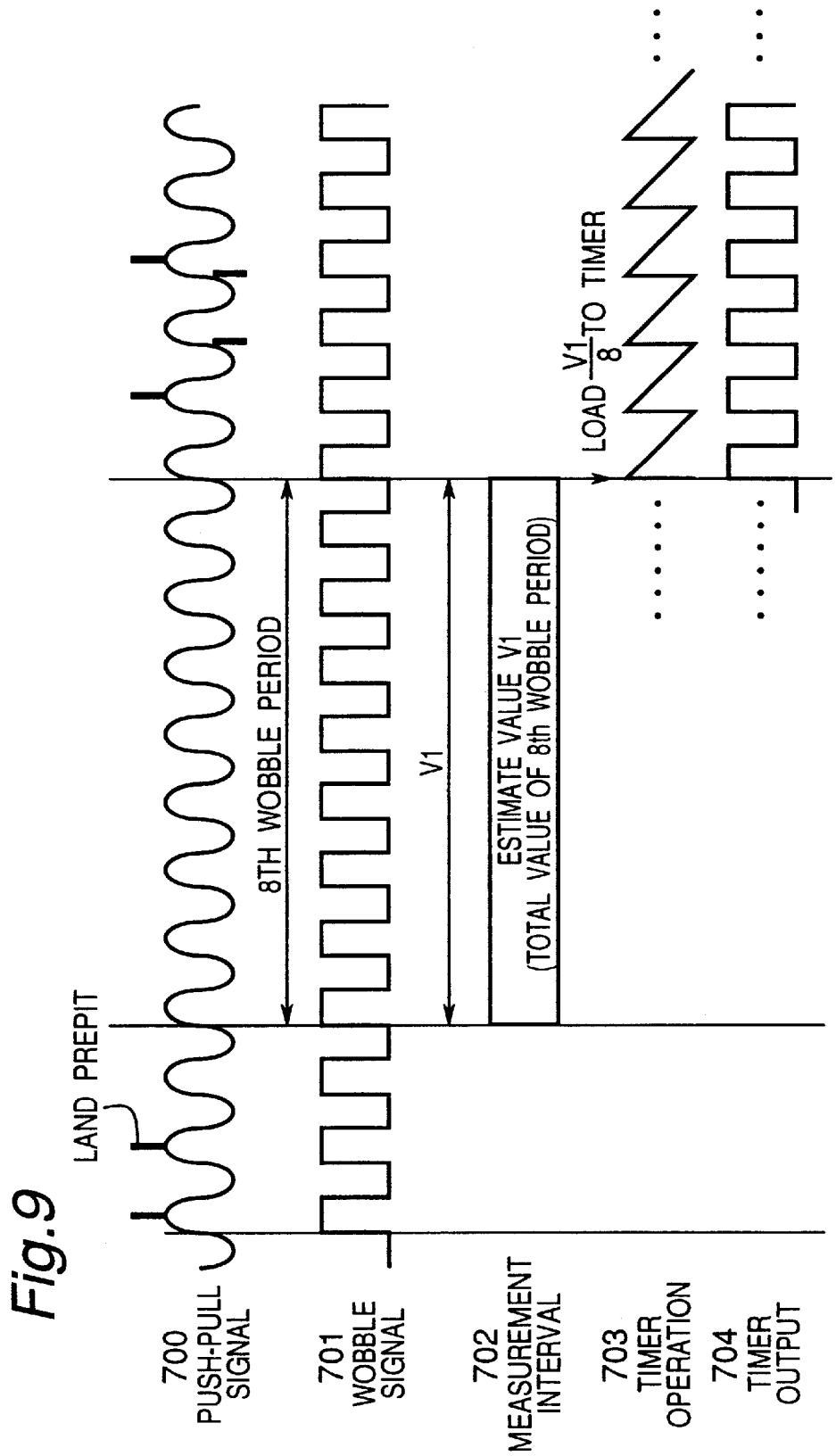
FIG. 9 is a second diagram describing the operation of the period averaging circuit in the first embodiment of the invention.

It should be noted that the period averaging interval can be extracted as shown in FIG. 9, which is a second operating example of the period averaging circuit 24. In this case, the period averaging interval 702 is an 8 wobble period interval having no land prepits on either the inside or the outside circumference side of the disk. The effects of land prepits on the wobble signal period can be completely eliminated at both the inside and outside circumference sides by obtaining the average period in an area where there are no land prepits. An interval with no land prepits can be detected by digitally detecting land prepits on both the top (outside circumference) and the bottom (inside circumference) of the push-pull signal.

Figure 7:
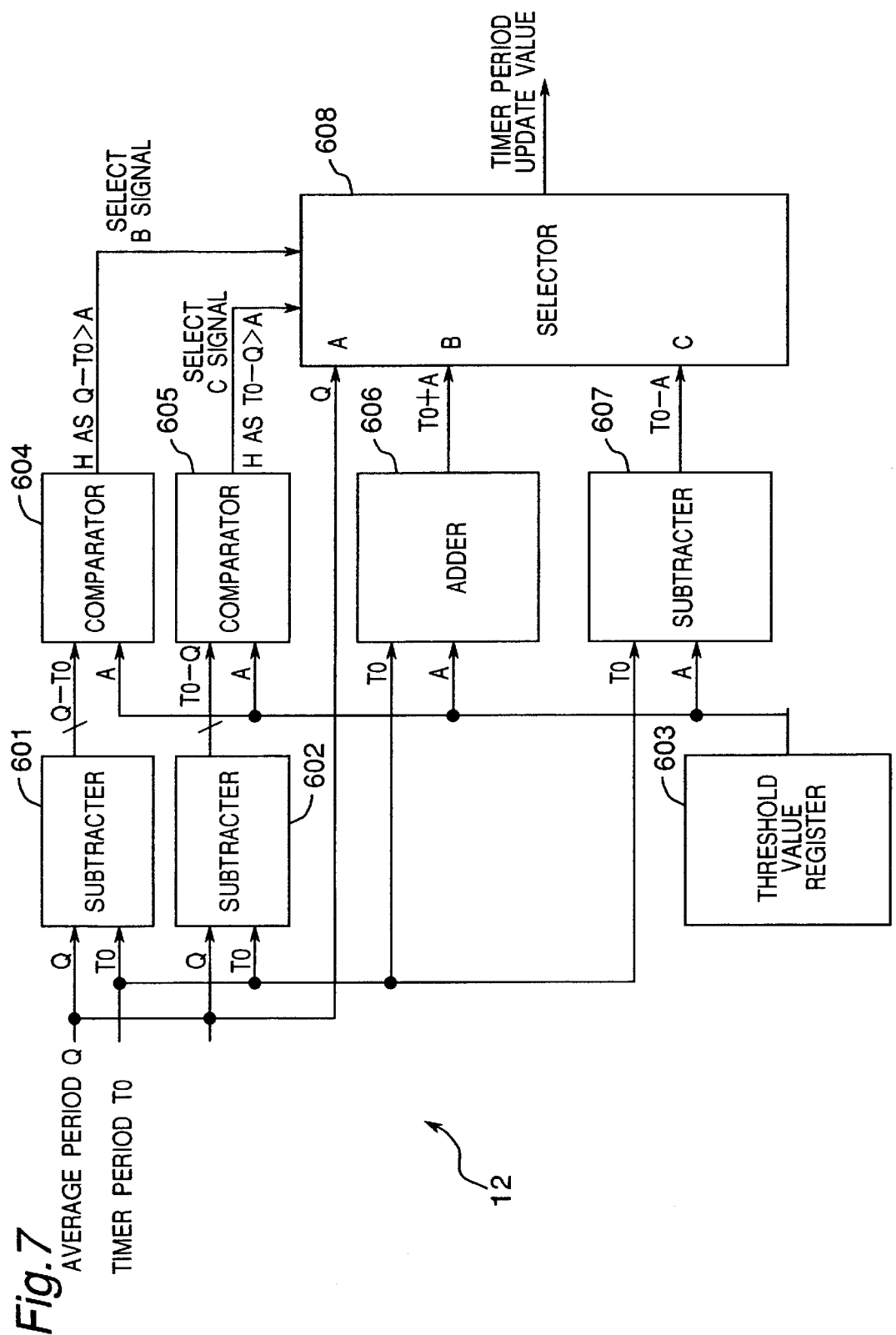
FIG. 7 is a block diagram of a period comparison circuit in the first embodiment of the invention.

The operation of the period comparison circuit 12 will now be described in detail. FIG. 7 is a block diagram of the period comparison circuit 12, and FIG. 8 describes the operation of the period comparison circuit 12. Referring to FIG. 7, subtracter 601 obtains Q–T0, and subtracter 602 obtains T0–Q. Threshold value register 603 stores the specific value A (also referred to as the limit) defining the specified range. Comparator 604 compares Q–T0 and A, comparator 605 compares T0–Q and A, adder 606 obtains T0+A, and subtracter 607 obtains T0–A. Reference numeral 608 is a selector. In the flow chart in FIG. 8, the symbols are defined in step 610, the period average and timer period are compared in steps 611 and 612, and the results are loaded to the timer in steps 613 to 615.

Figure 8:
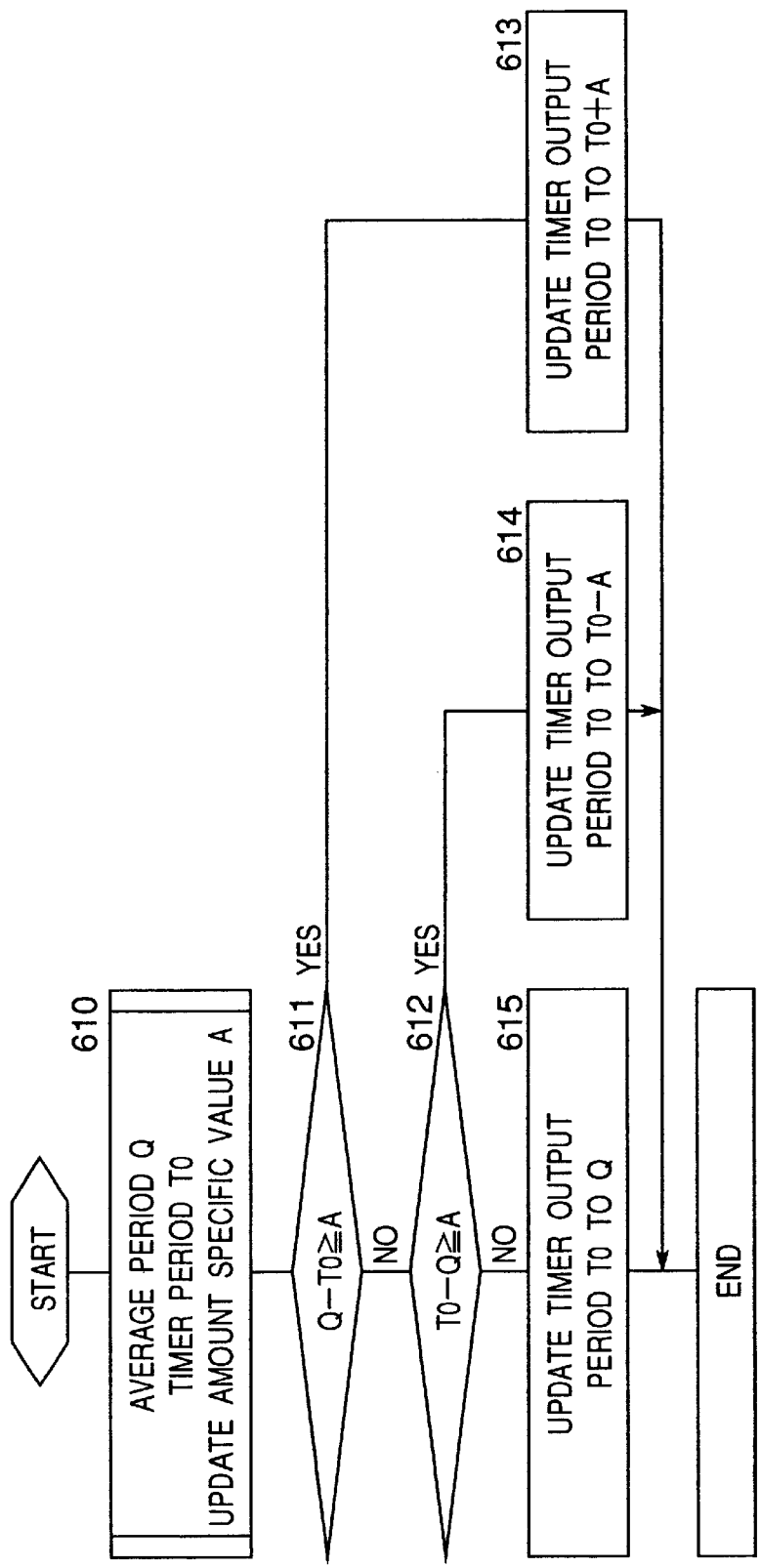
FIG. 8 describes the operation of the period comparison circuit in the first embodiment of the invention.

The symbol definition in step 610 in FIG. 8 will now be described first. That is, Q is the average period that is obtained by the period averaging circuit 24; T0 is the timer oscillation period, that is, the previously loaded timer value; and A is the update limit. Ideally, Q and T0 are equal. Next, subtracter (Q–T0) 601 outputs the result of the timer period T0 being subtracted from average period Q. Subtracter (T0–Q) 602 outputs the difference of the average period Q subtracted from the timer period T0. Limit A is stored in the threshold value register 603.

As shown in steps 611 and 613, if the average period Q is greater than timer period T0 by A or more, the comparator (Q–T0 and A) 604 instructs the selector 608 to select the output from the adder (T0+A) 606. Because the adder 606 outputs T0+A, the average period that is output to the timer is not Q but T0+A.

As shown in steps 612 and 614, if the average period Q is smaller than timer period T0 by A or more, the comparator (T0–Q and A) 605 instructs the selector 608 to select the output from the subtracter (T0–A) 607. Because the subtracter 607 outputs T0–A, the average period output to the timer is not Q but T0–A.

If neither comparator 604 or 605 applies a select signal to the selector 608, the selector 608 selects the average period Q and the timer period update value is also Q.

At an inside circumference position with a diameter of 48 mm on DVD-R media, for example, the length of 16 wobble periods is 396 $\mu$m, and the number of times the timer is reset, that is, the number of times the average wobble period is measured, in one revolution with the example shown in FIG. 6 is $$48 \text{ (mm)} \times 3.14 \times 1000/396 \text{ } (\mu m) = 380 \text{ (times)}.$$

The maximum change in speed at the maximum acceleration or deceleration of the disk motor in a typical optical disk drive is at most 10% per disk revolution. This means that the variation in period measurement each time the timer is reset is $$10(\%)/380(\text{times}) = 0.026(\%).$$

In reality, it is also necessary to consider the effects of period variation due to disk eccentricity, but a 3 per 10,000 timer period T0 count is appropriate for the limit A.

The operation at time T2 in FIG. 6 will now be described with the above taken into consideration. V2/16 is calculated at time T2, and the result of V2/16 is compared with the value V1/16 that is held in the period hold circuit 30. The value which is stored in the period hold circuit 30 is the reference value for this comparison. If the difference between V2/16 and V1/16 is outside a specified range (not within ±A), V2/16 is not an appropriate value. If the difference is within a specified range (within ±A), V2/16 is an appropriate value. If V2/16 is not appropriate, V2/16: is increased or decreased by a specific value A, and the result of this operation is loaded to the timer 15. If V2/16 is appropriate, V2/16 is loaded to the timer 15. The value that is loaded to the timer 15 is also loaded to and held by the period hold circuit 30. The timer 15 can also be started at time T2 with the value that is loaded to the timer 15 after counting starts.

The result of V2/16 may be determined to be inappropriate if 16 wobble periods should have been counted but an extraneous period was counted because of the presence of dust or a scratch on the disk. For example, if an interval of 15 wobble periods is counted but an extra period is counted because of the presence of dust or a scratch, the interval will be shorter than the normal interval by 15/16 (=0.9375). In this case, the value that is loaded to the timer 15 is a value which is equal to V2/16 minus the specific value A (according to the above example, the value will be 0.9997 instead of the actual counted value), and the value V2/16, which will be utterly different, will not be used.

Another example of why the measured value may be inappropriate is if one wobble signal could not be read even though 16 wobble periods should have been counted. This means that the interval containing 17 wobble periods is counted. If a wobble signal is not detected, then the average period will be greater than the normal count, that is, 17/16 (=1.0625). In this case, the value that is loaded to the timer 15 is a value which is equal to V1/16 plus the specific value A (according to the above example, the value will be 1.0003 instead of the actual counted value), and the value V2/16, which is utterly different, will not be used.

The operation described above thus suppresses a sudden change in timer output and assures that the change in the updated period is less than a specific value A even when the wobble period changes suddenly due to some unexpected reason. Change in the wobble signal period exceeding disk eccentricity or the maximum disk motor acceleration is in principle not possible under normal operating conditions, and suppressing variation in the wobble period exceeding this level is therefore an effective way to improve recording clock stability.

It is therefore possible by means of this first embodiment of the present invention to minimize the effects on the wobble signal of land prepits and When the effects of land prepits or recording power modulation result in local variations in the wobble signal period, the period averaging arrangement of this first embodiment is able to minimize such effects and accurately detect the wobble period. Two different methods for making the period averaging circuit resistant to the effects of the land prepits are described above. The effects of noise and wobble phase fluctuation due to recording power modulation can be effectively eliminated by averaging the wobble period because the direction of phase fluctuation is random. In addition, if the wobble signal period is temporarily or locally deficient, such as immediately after recording starts or ends or due to the presence of dust on the disk surface or other such factor, the correct recording clock can still be generated by holding the timer output period for that time.

It will be apparent that greater resistance to the effects of external disruptions can be achieved by using a longer period averaging interval, but the period averaging interval must be determined with consideration for a recording clock response to the change in the linear velocity. For example, if the frequency response of the recording clock to a change in linear velocity is approximately 2 kHz, the period averaging interval is appropriately set to 500 $\mu$sec or less.

Second Embodiment

Figure 10:
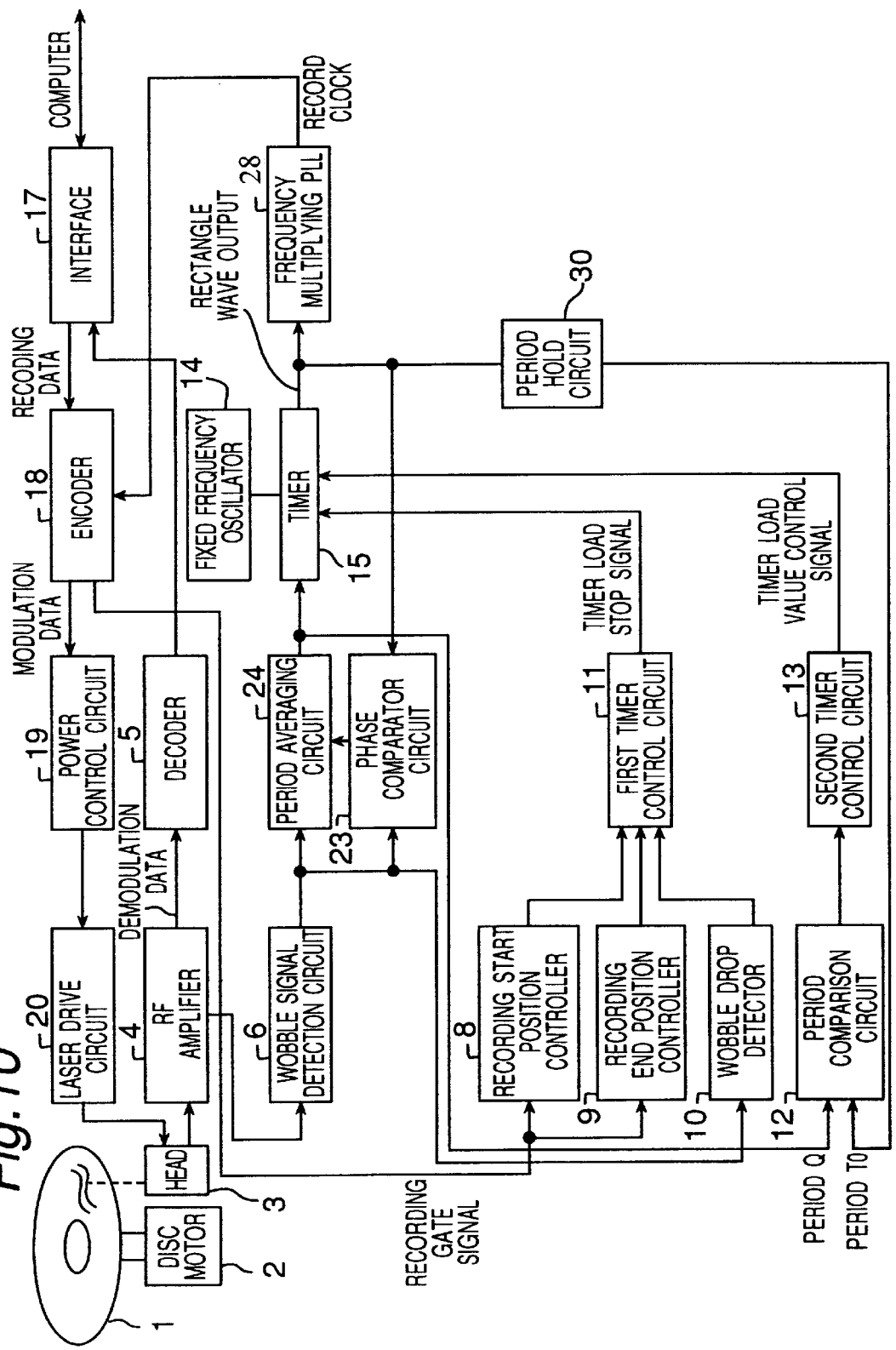
FIG. 10 is a block diagram of a second embodiment of the invention.

FIG. 10 is a block diagram of a second embodiment of the present invention. The optical disk 1, disk motor 2, head 3, RF amplifier 4, decoder 5, wobble signal detection circuit 6, recording start position controller 8, recording end position controller 9, wobble drop detector 10, first timer control circuit 11, period comparison circuit 12, second timer control circuit 13, fixed frequency oscillator 14, timer 15, frequency multiplying PLL 28, interface 17, encoder 18, power control circuit 19, and laser drive circuit 20 shown in FIG. 10 are identical to those of the first embodiment described above and a further description thereof is therefore omitted. Also shown are a phase comparator circuit 23 for comparing the wobble signal and the timer output phase, and a period averaging circuit 24 for determining the timer setting based on the wobble period that is detected by the wobble signal detection circuit 6 and the phase difference that is detected by the phase comparator circuit 23.

The operation of the period averaging circuit 24 and the phase comparator 23 will now be described in detail.

Figure 11:
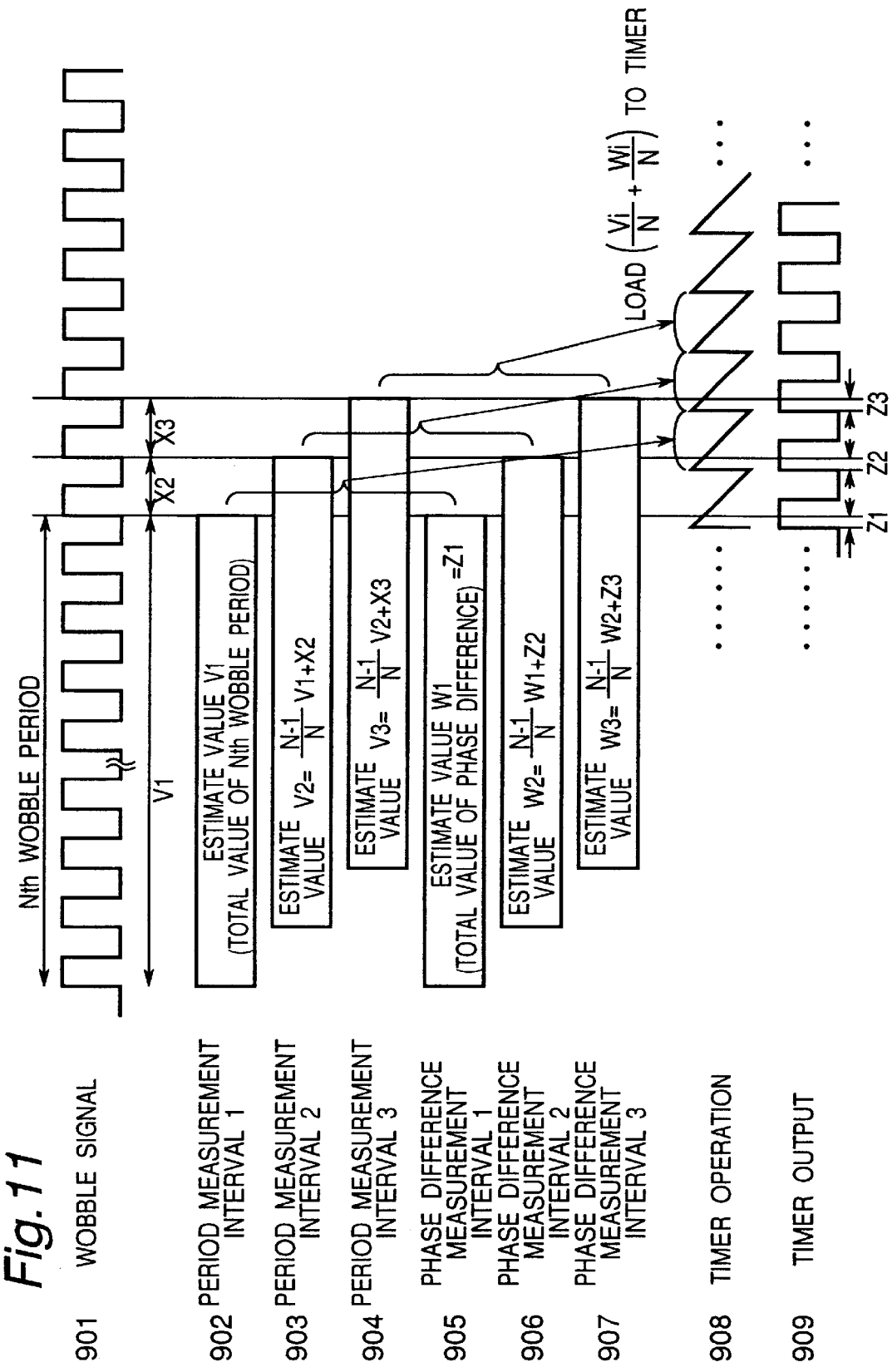
FIG. 11 describes the operation of the period averaging circuit in the second embodiment of the invention.

FIG. 11 describes the operation of the period averaging circuit 24. In FIG. 11, reference numeral 901 is the wobble signal 901, and reference numeral 902 is period measurement interval 1 902, the length of which is indicated by the rectangle. Period measurement is assumed to measure N periods (where N is a specific integer). Reference numeral 903 is period measurement interval 2, the length of which is indicated by the rectangle, and reference numeral 904 is period measurement interval 3, the length of which is indicated by the rectangle.

In addition to measuring the wobble period, this second embodiment of the present invention also measures the phase difference between the wobble signal and the timer output. Reference numeral 905 indicates phase measurement interval 1 indicated by the length of the rectangle. In the phase measurement interval 1, a cumulative phase difference W1 (=Z1) is measured. As shown at the bottom of FIG. 11, Z1 indicates a phase difference between the wobble signal and the rectangular wave output of the timer that is observed at the end of measurement interval 1. Likewise, reference numeral 906 indicates phase measurement interval 2. Z2 indicates a phase difference that is observed at the end of interval 2 indicated by the length of the rectangle. Reference numeral 907 indicates phase measurement interval 3. Z3 indicates a phase difference that is observed at the end of interval 3 indicated by the length of the rectangle. Reference numeral 908 indicates timer operation, and 909 indicates the rectangular wave output of the timer.

In the first embodiment described above, time is measured and the average period is determined for every 16 wobble periods with no overlap between the measurement periods. In this second embodiment, however, the average period is determined by using both a wobble period measurement and phase difference measurement. Measuring the wobble period will now be described first.

In this second embodiment, the average period is recalculated at each input wobble signal period, and the period average is determined by using a moving average. More specifically, if V1 is the time of N wobble signal periods that are measured in the period measurement interval 1 902, and X2 and X3 are the wobble signal input periods after V1, then a new cumulative period V2 is obtained by subtracting V1(1/N) from V1 and adding X2, that is, $$V2=((N-1)/N) \times V1+X2.$$

The reason for using an approximation with V1 and X2 rather than using the measured value for V2 is because it is not necessary to store the starting point for all measurement intervals. That is, if an approximation is not used, then it is necessary to measure all N intervals in parallel, thus requiring N interval measurement counters. Likewise, when the next wobble signal period X3 is input the cumulative value V3 for interval 3 is V2 minus V2(1/N) plus X3, that is, $$V3=((N-1)/N) \times V2+X3.$$

The wobble signal and timer output phase difference will now be described. A rectangular wave with substantially the same period as the wobble period can be derived by simply applying the calculated average period to the timer, but this can also result in the accumulation of a phase difference between the original wobble signal and the rectangular output wave of the timer due to a rounding error in the period averaging operations or the measurement resolution of the period average. Even if the phase difference in each measurement interval is slight, phase difference accumulation can increase the phase difference between the recording clock and land prepits on the disk to an unacceptable level. The phase difference Z between the wobble signal and the rectangular output wave of the timer is therefore reflected in the value that is loaded to the timer so as to control the phase difference Z to be small all the time. More specifically, if Z1 (the initial value of the cumulative phase difference is W1=Z1) is the phase difference between the wobble signal and rectangular output wave of the timer at the point when N wobble periods are measured, the value next loaded to the timer is the sum of 1/N of V1 and 1/N of W1, as shown in row 909 of FIG. 11. The reason for dividing W1 by N is that a sudden change in the timer period is avoided and recording clock jitter is improved by dispersing phase error over N periods and reflecting this in the timer setting.

If the phase difference is decreasing, that is, the timer phase is delayed relative to the wobble signal, W1 is added to V1, and if the timer phase is advanced, W1 is subtracted from V1. Likewise, if Z2 is the phase difference at the next wobble signal input, the value that is reflected in the timer setting as the cumulative phase difference W2 is, as with the period measurement, W1 minus W1(1/N) plus Z2, or $$W2=((N-1)/N) \times W1+Z2,$$

and the value that is loaded to the timer 15 is (V2+W2)/N. At the next period X3, the same operation is applied for phase difference Z3, and (V3+W3)/N is loaded to the timer 15. Note that the phase difference correction shown in rows 905, 906, and 907 in FIG. 11 can also be omitted.

This second embodiment of the present invention can smoothen the change in the timer output period as compared with the first embodiment, and can be expected to improve jitter in the recording clock which is obtained by multiplying the timer output, by updating the period average every wobble period. In addition, by reflecting the wobble signal and the timer output phase difference in the timer setting, the accumulation of period averaging rounding error and timer resolution error can be suppressed, and the wobble signal and timer output can be kept in phase.

Third Embodiment

Figure 1:
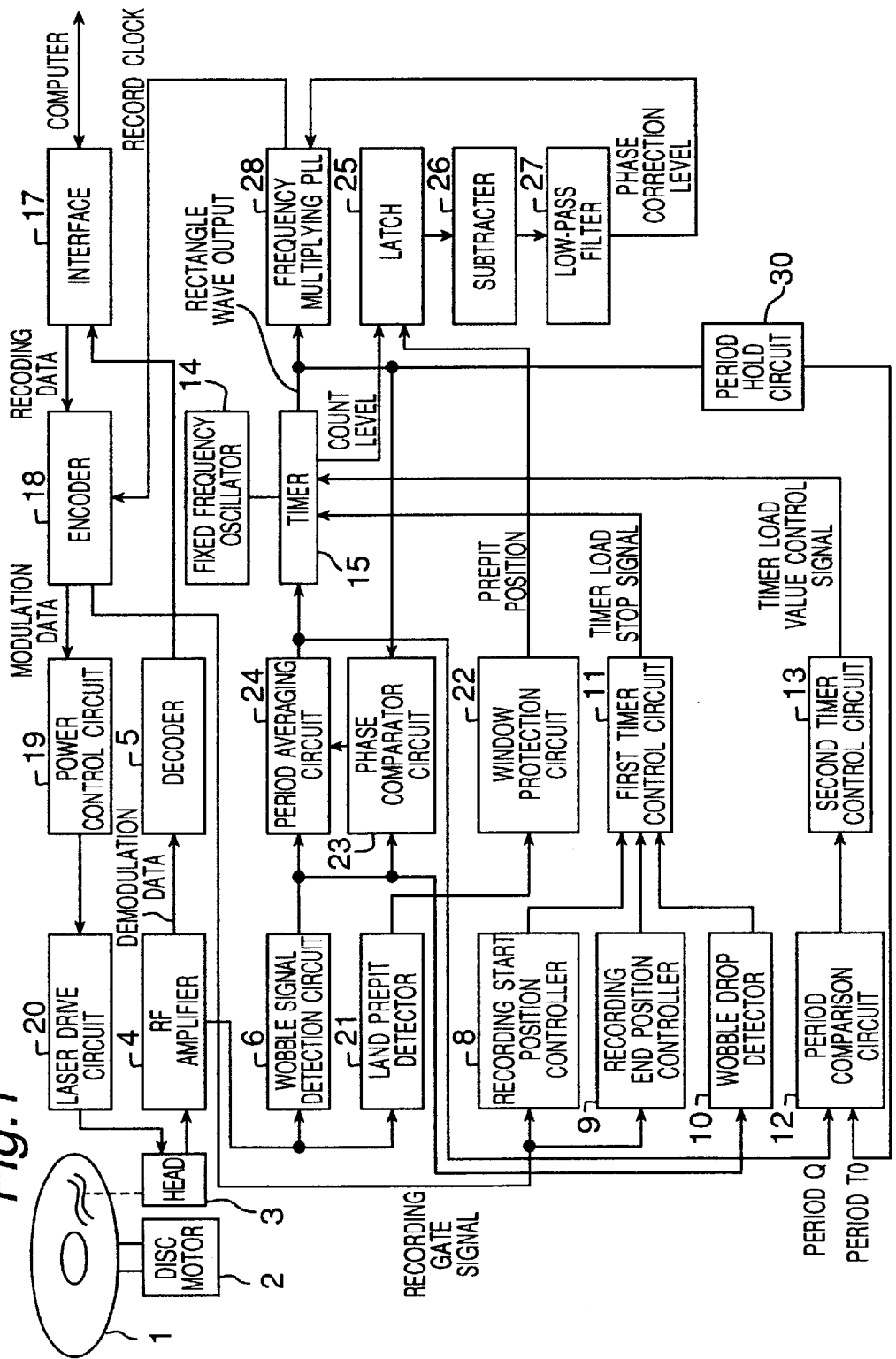
FIG. 1 is a block diagram of a third embodiment of the present invention.

FIG. 1 is a block diagram of a third embodiment of the present invention. As shown in FIG. 1 this third embodiment has the optical disk 1, disk motor 2, head 3, RF amplifier 4, decoder 5, wobble signal detection circuit 6, recording start position controller 8, recording end position controller 9, wobble drop detector 10, first timer control circuit 11, period comparison circuit 12, second timer control circuit 13, fixed frequency oscillator 14, timer 15, interface 17, encoder 18, power control circuit 19, laser drive circuit 20, phase comparator circuit 23, and period averaging circuit 24, which are identical to those of the second embodiment and for which a further detailed description thereof is therefore omitted. This third embodiment also has a land prepit detector 21 and a window protection circuit 22 as described in the first embodiment.

In addition, a latch 25 latches the count of the timer 15 when a land prepit is detected in the window. This results in the measurement from the rising edge of the rectangular output wave of the timer to the land prepit being input to the latch 25. A subtracter 26 decreases the latch content by a specific number. A low-pass filter 27 is a digital filter that passes only the low frequency component of the output of the subtracter 26. The basic PLL operation of the frequency multiplying PLL 28 is the same as in the first and second embodiments, but is additionally configured so as to correct the recording clock phase according to the output from the low-pass filter 27.

Figure 12:
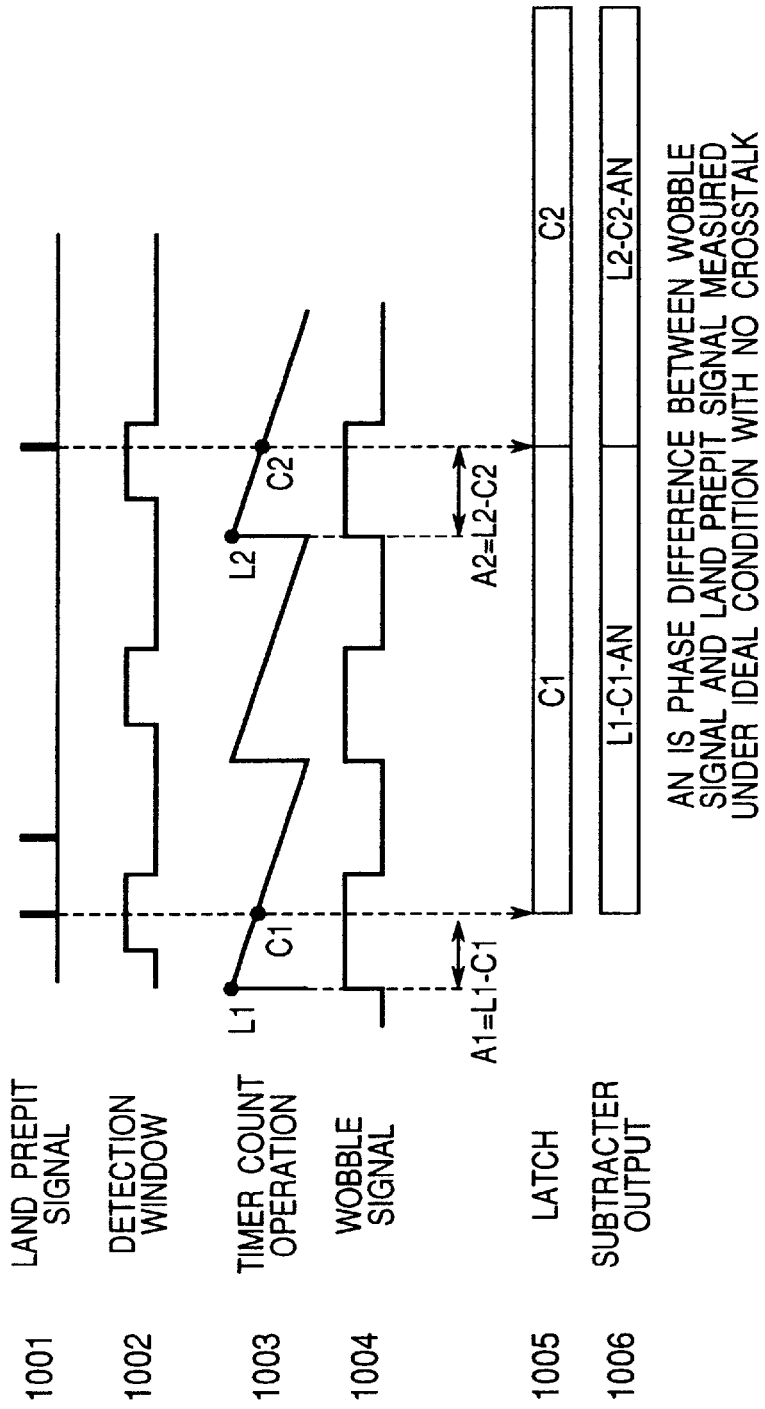
FIG. 12 describes the operation of phase difference detection in the third embodiment of the invention.

Described next with reference to FIG. 12 is how this third embodiment detects the phase difference of the wobble signal and the land prepit signal. In FIG. 12, reference numeral 1001 is the land prepit signal, 1002 shows the detection window, 1003 shows the timer counting operation, 1004 shows the wobble signal, 1005 shows the latch output, and 1006 shows the subtracter output. The detection window 1002 area removes detection error components outside of the window are from the land prepit signal 1001. As shown in row 1003, the timer normally counts down, and a new average period is loaded when the count reaches zero. The average period that is loaded is shown by L1 and L2 in FIG. 12. If a land prepit signal is detected in the window, the timer count C1 at that detection position is copied to the latch 1005. The wobble signal and land prepit signal phase difference A1 is determined by using the latched value as A1=L1−C1. If the wobble signal and land prepit signal phase difference AN under ideal conditions with no crosstalk between tracks is known, the wobble signal and land prepit signal phase difference can be consistently held to a level where there is no crosstalk between tracks by A1−AN, that is, L1−C1−AN phase correcting the frequency multiplying PLL 28. L1−C1−AN is output by subtracter 26. The output of the subtracter 26 is passed through the low-pass filter 27 with a cutoff frequency of several kHz, and is applied to the frequency multiplying PLL 28 as the phase correction signal. A low-pass filter 27 is used to remove jitter due to differences in photodetection levels in the recording pulse marks and spaces during recording and differences in the photodetection levels in the marks and spaces during playback, and to suppress the response of the frequency multiplying PLL 28 to undetected land prepits and detection errors.

Figure 13:
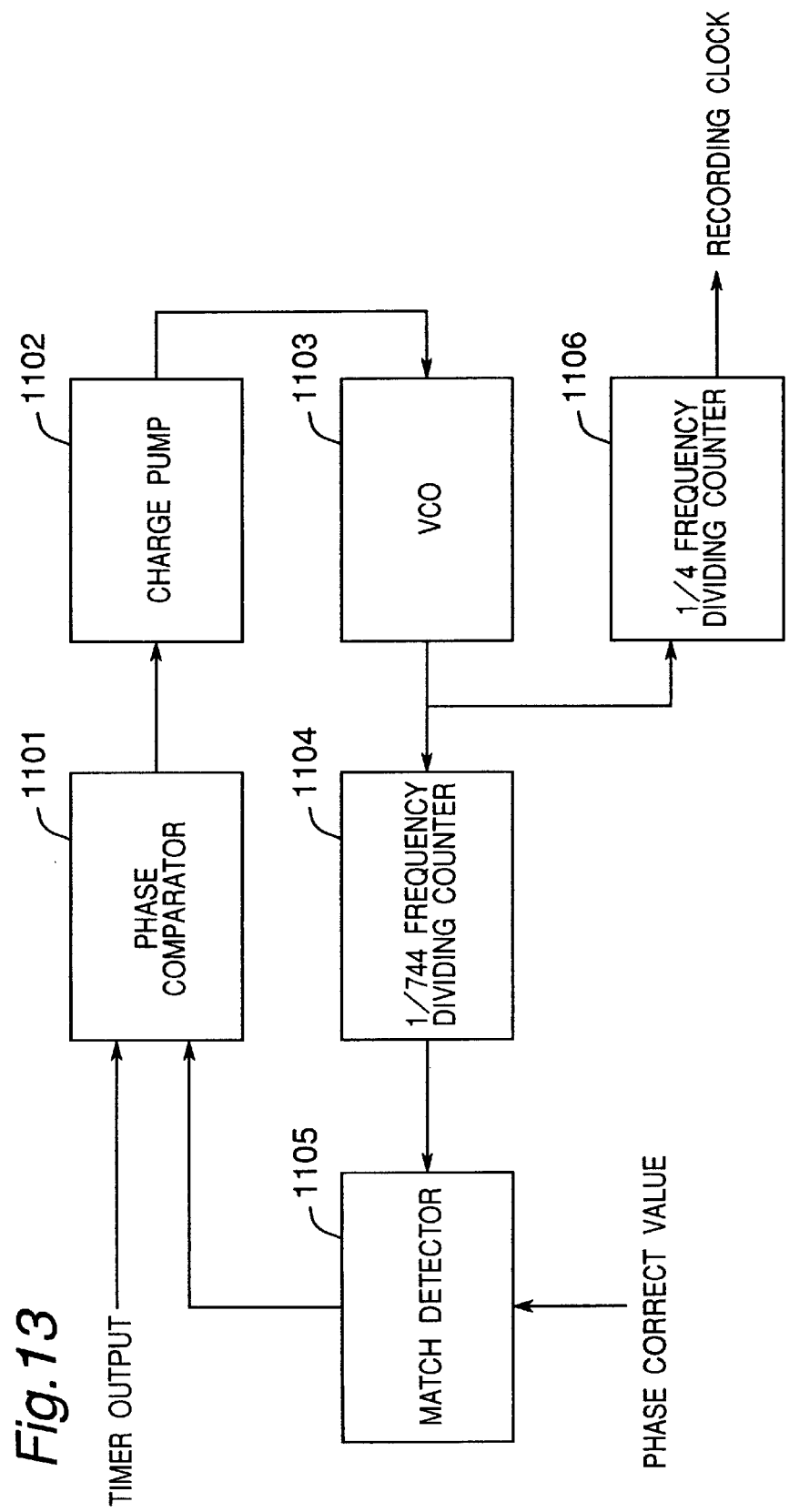
FIG. 13 is a block diagram of a frequency multiplying PLL in the third embodiment of the invention.

The frequency multiplying PLL 28 will now be described with reference to FIG. 13, which is a block diagram of the frequency multiplying PLL 28. As shown in FIG. 13, the frequency multiplying PLL 28 has a phase comparator 1101 for comparing the phase of the timer output and the rising edge of a match detector 1105, a charge pump 1102, a VCO 1103, a 1/744 frequency dividing counter 1104, a match detector 1105, and a 1/4 frequency dividing counter 1106 for outputting the recording clock.

The phase correction resolution of this third embodiment is 1/4th the period of the recording clock, and the VCO oscillation frequency is therefore four times the recording clock. The recording clock is therefore the output of the VCO 1103 frequency divided by the 1/4 frequency dividing counter 1106. Because the wobble signal frequency is 1/186th the recording clock, the frequency divider must divide the VCO output by four times the wobble signal frequency, or 186×4=744, and a 1/744 frequency dividing counter 1104 is therefore provided. When there is no phase correction, the match detector 1105 generates a rectangular wave containing a rising edge pulse every time the count of the 1/744 frequency dividing counter 1104 goes to 0. The phase comparator 1101 compares the rising edges of the rectangular wave that is output by the match detector 1105 and the rectangular output wave of the timer, drives the charge pump 1102 according to the phase difference, and thus controls the output frequency of the VCO 1103.

Figure 14:
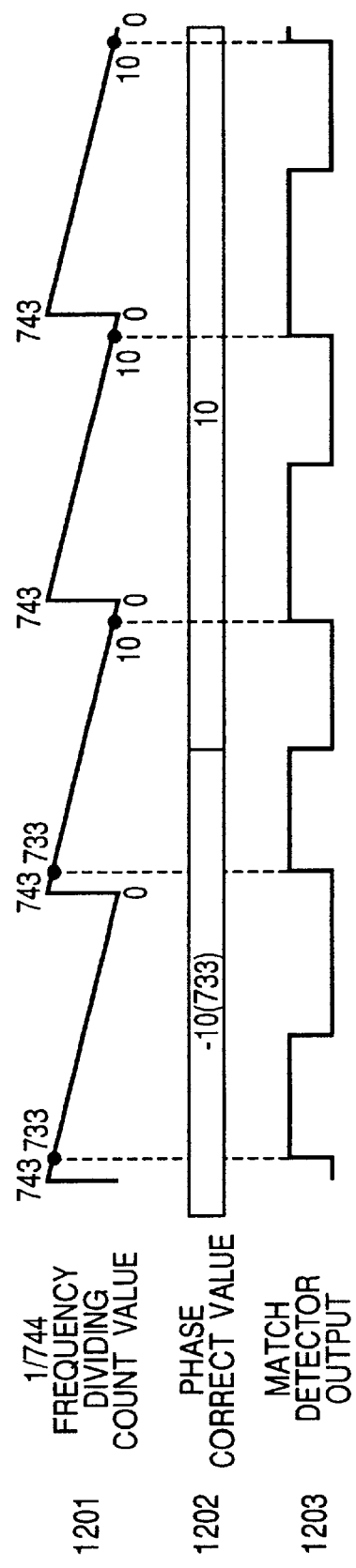
FIG. 14 describes the operation of a frequency multiplying PLL in the third embodiment of the invention.

The phase correction operation of the frequency multiplying PLL 28 will now be described with reference to FIG. 14. Reference numeral 1201 in FIG. 14 indicates the count of the 1/744 frequency dividing counter 1104. This frequency divider 1104 is a counter operating at a fixed frequency division ratio, and the count therefore repeatedly counts down from 743 to 0. The phase correction 1202 is the value that is output from low-pass filter 27. For convenience, this timing chart of FIG. 14 shows a correction of −10 in the first part and +10 in the second part, but the correction does not actually change suddenly from −10 to +10 because a low-pass filter 27 with a cutoff frequency of several kHz is inserted. The match detector 1105 outputs a rising edge waveform when the count of the 1/744 frequency dividing counter 1104 reaches −10 (that is, 733) if the correction is −10, and outputs a rising edge waveform when the count reaches +10 if the correction is +10. The phase of the rectangular wave that is output from the match detector 1105 is thus corrected in ¼ period units of the recording clock according to the phase correction setting. If the wobble signal phase advances relative to the land prepit signal due to intertrack crosstalk and the timer output phase also advances, PLL output phase variation can be cancelled by applying control so that the match detector 1105 output phase also advances an amount which is equal to the output of the low-pass filter. Conversely, if the wobble signal phase is delayed, control is applied so as to delay the phase of the match detector 1105. The phase comparator 1101 can be configured so as to compare only rising edges and it is therefore not necessary to precisely determine the position of the falling edge of the rectangular wave that is output by the match detector 1105, but a design controlling the falling edge to approximately half the count, that is, about 370, could be used.

It should be noted that because the phase difference of the wobble signal and the land prepit signal is measured at the frequency resolution of the fixed frequency oscillator 14 and because the phase correction unit of the frequency multiplying PLL 28 is determined by the oscillation frequency of the VCO 1103, it may be necessary to convert the unit that is used for correction if these frequencies are not the same.

It will also be noted that while phase correction is applied to the output of the VCO 1103 in this third embodiment, the same effect can be achieved by phase correcting the timer output. Conversion of the correction unit will not be necessary in this case if the timer output phase is corrected by using the same clock as the timer.

This third embodiment of the present invention can easily detect the phase of the wobble signal and the land prepit signal and can correct the phase of the recording clock using the land prepit signal by effectively combining a frequency multiplying PLL with a small scale, digitally configurable period averaging circuit and low-pass filter.

The wobble frequency is 140 kHz, the land prepits appear every two frames (approximately 10 kHz), the PLL response band from tracking disk eccentricity is approximately 1 kHz, and wobble interference between tracks has a relatively slow period of 5.3 revolutions in DVD-R media. The timer phase correction response speed of 140 kHz in the period averaging circuit is therefore sufficient to measure the phase difference between the wobble signal and the land prepits appearing at approximately 10 kHz. Furthermore, by setting the cutoff frequency of the low-pass filter to approximately 1 kHz, it is possible to phase correct the frequency multiplying PLL while tracking changes in the linear disk velocity and suppress land prepit high frequency jitter. It is also possible to minimize the increase in jitter in the recording clock even if there are land prepit detection errors or undetected land prepits by using a low-pass filter.

Fourth Embodiment

Figure 15:
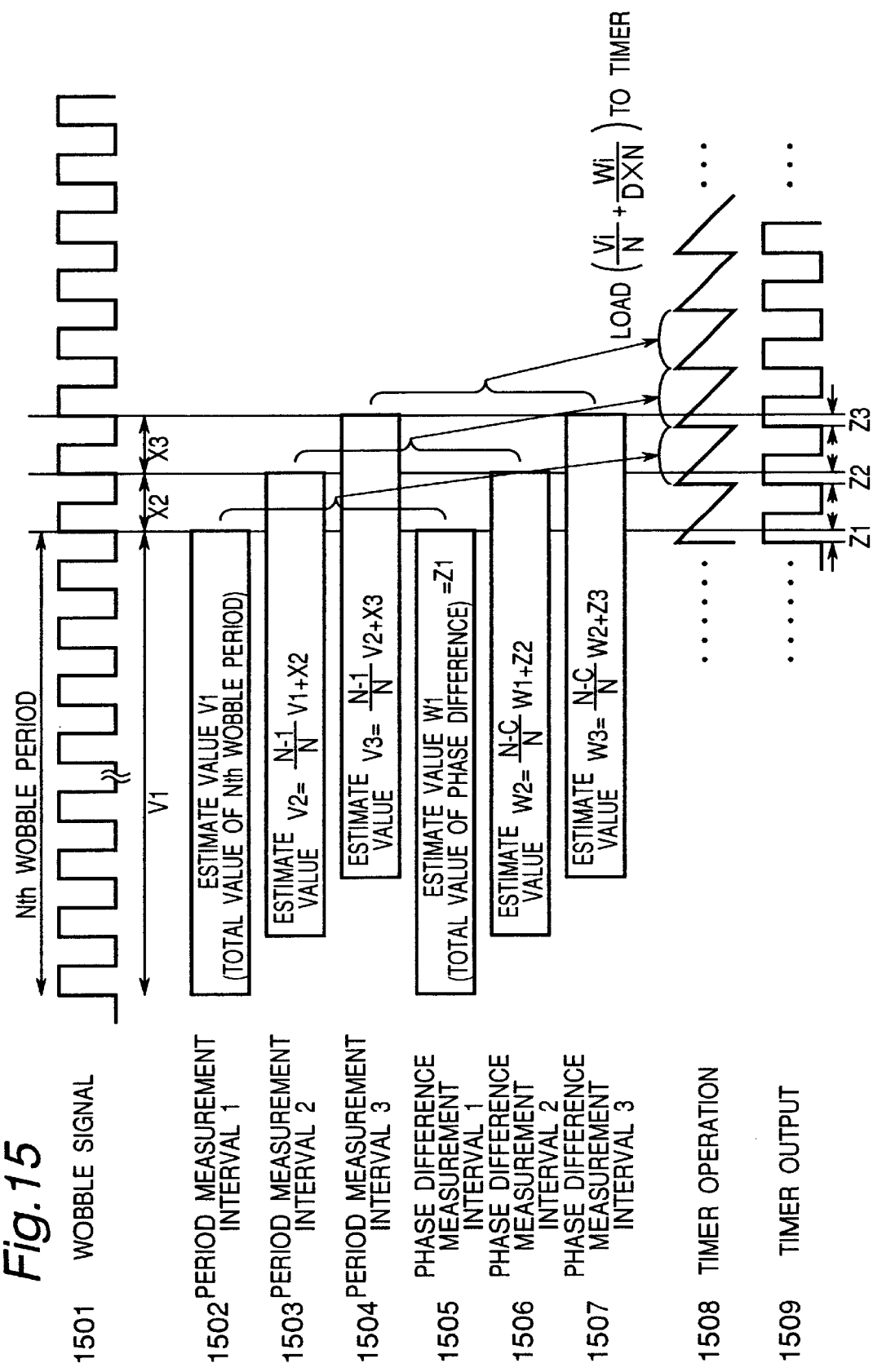
FIG. 15 describes the operation of the period averaging circuit in a fourth embodiment of the invention.

The operation of the period averaging circuit according to an alternative method is described in detail according to a fourth embodiment of the present invention with reference to FIG. 15. The block diagram for this period averaging circuit is the same as in the second embodiment and a further description thereof is therefore omitted. Shown in FIG. 15 are wobble signal 1501, period measurement interval 1 1502, period measurement interval 2 1503, period measurement interval 3 1504, phase difference measurement interval 1 1505, phase difference measurement interval 2 1507, timer operation 1508, and rectangular output wave 1509 outputted from the timer.

The wobble period measurement method of this fourth embodiment will now be described. Cumulative period values V1, V2, V3, . . . are as in the second embodiment, but the method of calculating the cumulative phase difference and calculating the phase difference that is applied to the timer differ from those of the second embodiment. In this fourth embodiment of the present invention, a fixed attenuation constant is applied to the phase difference between the wobble signal and the rectangular output wave of the timer, and the result is reflected in the timer setting.

More specifically, as shown in row 1509, if Z1 (the initial value of W1 is Z1) is the phase difference between the wobble signal and the rectangular output wave of the timer when N wobble periods are measured, the value to which the timer is set next is the total of V1/N and W1/(D×N), where D is the attenuation constant. The phase difference that is reflected in the timer setting is W1/(D×N) because the timer period tracks the wobble period more stably if the phase difference is multiplied by the attenuation constant D and is dispersed to N periods. If the phase difference when the next wobble signal is input is Z2, the cumulative phase difference W2 is $$W2=((N-C)/N)\times W1+Z2,$$

where C is the attenuation constant. Constant C is subtracted to adjust the gain of the phase difference to cumulative value W1. The value that is loaded as the timer setting is the total of V2/N and W2/(D×N). The timer is reset in the same way at subsequent periods.

For example, by using a period averaging interval which is equal to 128 wobble periods (N=128), an attenuation constant C=4, and an attenuation constant D=2, the amount of phase difference feedback can be suppressed, and variation in the timer output, that is, the average wobble signal period, can be suppressed with the effect particularly noticeable when variation in the input wobble signal period is great. Note that the period averaging interval can be different for measuring cumulative period values and cumulative phase difference.

By thus applying a constant attenuation constant to the wobble signal and the timer output phase difference so as to smoothly reflect the correction in the timer setting, accumulation of a wobble signal and timer output phase difference can be prevented, and destabilizing the timer output by a sudden feedback of a cumulative phase error can be prevented even when there is a sudden change in the wobble signal period.

A recording clock generator according to the present invention can generate a stable recording clock by averaging a variation in the wobble signal period resulting from wobble signal phase variation due to crosstalk and other interference from adjacent tracks, wobble signal phase variation due to land prepit signal leakage, wobble signal phase variation due to the leakage of recording power modulation components, and other noise sources.

Furthermore, by holding the output period of a timer oscillating at the average period of the wobble signal when a RF amplifier response is transient at the start and end of recording, or when the wobble signal is dropped due to the presence of dust on the disk surface, for example, deterioration of the frequency multiplying PLL output, that is, increase in recording clock jitter, can be minimized.

Yet further, the effects of high frequency jitter and signal dropout can be suppressed and the phase jitter of the recording clock to the disk can be greatly improved even when there is high frequency jitter, detection errors, and dropped land prepits in the land prepit signal by using a signal that is passed through a low-pass filter as the phase correction signal for the recording clock.

Yet further, the period averaging circuit, timer, low-pass filter, and other components of the present invention can be achieved in relatively small scale digital circuits. More particularly, a single frequency multiplying PLL can be used so as to generate a recording clock which has been phase corrected based on the land prepit signal and which has little jitter, and the practical applications for the present invention are thus great.

The present invention being thus described, it will be obvious that the same may be varied in many ways. Such variations are not to be regarded as a departure from the spirit and scope of the present invention, and all such modifications as those that would be obvious to one skilled in the art are intended to be included within the scope of the following claims.

What is claimed is:

1. A recording clock generating device for recording data to an optical disk having a recording groove wobbled at a specific frequency in the radial direction, and prepits formed at a unit interval including a specific number of wobble periods, said device comprising:

a wobble signal detector for detecting recording groove wobble and outputting a wobble signal;

a period averaging arrangement for obtaining an average period for periods of the wobble signal;

a timer for generating a rectangular wave with a period which is substantially equal to the average period obtained by the period averaging arrangement;

a frequency multiplying PLL for multiplying timer output and generating a recording clock; and a phase difference measuring set for measuring a phase difference Z between the wobble signal and the rectangular wave;

wherein the period averaging arrangement has
      a set for measuring a total time of N wobble signal periods, where N is a specific integer and holding the measured total time as a cumulative period V, and
      a set for measuring a next wobble period X, subtracting (1/N) of the cumulative period V from the cumulative period V, adding X to the resultant difference, correcting the measured phase difference Z, and using the resultant sum as a new total time for the N periods.

2. A recording clock generating method for recording data to an optical disk having a recording groove wobbled at a specific frequency in the radial direction, and prepits formed at a unit interval including a specific number of wobble periods, said method comprising:

a wobble signal detection operation of detecting recording groove wobble and outputting a wobble signal;

a period averaging operation of obtaining an average period for periods of the wobble signal;

an operation of generating a rectangular wave with a period which is substantially equal to the obtained average period;

an operation of multiplying timer output and generating a recording clock; and an operation of measuring a phase difference Z between the wobble signal and the rectangular wave;

wherein the operation of generating the rectangular wave includes
      a set which measures a total time of N wobble signal periods, where N is a specific integer, and holding the measured total time as a cumulative period V, and
      an operation of measuring a next wobble period X, subtracting (1/N) of the cumulative period V from the cumulative period V, adding X to the resultant difference, correcting the measured phase difference Z, and using the resultant sum as a new total time for the N periods.

* * * * *

UNITED STATES PATENT AND TRADEMARK OFFICE
CERTIFICATE OF CORRECTION

PATENT NO. : 6,856,586 B2
DATED : February 15, 2005
INVENTOR(S) : Makoto Usui et al.

It is certified that error appears in the above-identified patent and that said Letters Patent is hereby corrected as shown below:

Column 20,
Lines 12, 14, 16, 19, 21, 23 and 28, please replace "operation of" with -- operation for --.

Signed and Sealed this

Seventh Day of June, 2005

JON W. DUDAS
*Director of the United States Patent and Trademark Office*